(12) United States Patent
Saito

(10) Patent No.: US 11,276,683 B2
(45) Date of Patent: Mar. 15, 2022

(54) SEMICONDUCTOR DEVICE, SWITCHING POWER SUPPLY CONTROL IC, AND SWITCHING POWER SUPPLY DEVICE

(71) Applicant: FUJI ELECTRIC CO., LTD., Kawasaki (JP)

(72) Inventor: Masaru Saito, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 100 days.

(21) Appl. No.: 14/792,234

(22) Filed: Jul. 6, 2015

(65) Prior Publication Data

US 2015/0311197 A1 Oct. 29, 2015

Related U.S. Application Data

(63) Continuation of application No. PCT/JP2014/003021, filed on Jun. 6, 2014.

(30) Foreign Application Priority Data

Jun. 20, 2013 (JP) .............................. JP2013-129656

(51) Int. Cl.
*H02M 1/08* (2006.01)
*H01L 27/06* (2006.01)
(Continued)

(52) U.S. Cl.
CPC ...... *H01L 27/0629* (2013.01); *H01L 27/0611* (2013.01); *H01L 27/098* (2013.01);
(Continued)

(58) Field of Classification Search
CPC .... H02M 3/156; H02M 3/158; H02M 3/1588; H02M 2003/1566; H02M 3/155;
(Continued)

(56) References Cited

U.S. PATENT DOCUMENTS 5,285,369 A 2/1994 Balakrishnan
6,087,697 A * 7/2000 Patel ................. H01L 29/42376
257/327

(Continued)

FOREIGN PATENT DOCUMENTS

CN 102362354 * 3/2010
JP 61184886 A 8/1986
(Continued)

OTHER PUBLICATIONS

Semiconductor Device, Nakano, Yuki, Mitani, Shuhei, Miura, Mineao, Feb. 12, 2012, Rhom Co., Ltd, CN 102362354 (Year: 2012).*
(Continued)

*Primary Examiner* — Thienvu V Tran
*Assistant Examiner* — Lorena D Bruner
(74) *Attorney, Agent, or Firm* — Rossi, Kimms & McDowell LLP

(57) ABSTRACT

A semiconductor device has a configuration wherein a resistor that restricts overvoltage is inserted between an input terminal and the drain of JFETs, and the resistor is disposed on the JFETs. Also, the resistor is formed contiguously and integrally with a spiral form high breakdown voltage high resistance element that configures a resistive voltage divider circuit.

18 Claims, 23 Drawing Sheets

(51) Int. Cl.
*H01L 29/40* (2006.01)
*H01L 27/098* (2006.01)
*H01L 29/06* (2006.01)
*H01L 29/808* (2006.01)
*H02M 3/335* (2006.01)

(52) U.S. Cl.
CPC ........ *H01L 29/0692* (2013.01); *H01L 29/402* (2013.01); *H01L 29/808* (2013.01); *H02M 1/08* (2013.01); *H02M 3/33523* (2013.01)

(58) Field of Classification Search
CPC ....... H02M 3/1582; H02M 2003/1557; H02M 3/154; H02M 2003/1554; H04B 2215/069; H02B 2215/069
USPC .................. 323/282; 257/256, 272, 335–341
See application file for complete search history.

(56) References Cited

U.S. PATENT DOCUMENTS

| | | | | |
|---|---|---|---|---|
| 6,093,948 | A * | 7/2000 | Zambrano | H01L 29/1095 257/335 |
| 6,373,544 | B1 * | 4/2002 | Hirabayashi | G02F 1/136277 257/E27.111 |
| 7,750,402 | B2 * | 7/2010 | Kobayashi | H01L 29/66325 257/336 |
| 2004/0052092 | A1 | 3/2004 | Hirosawa | |
| 2008/0117653 | A1 | 5/2008 | Saito | |
| 2009/0242977 | A1 * | 10/2009 | Kawaguchi | H01L 29/66666 257/330 |
| 2012/0154026 | A1 | 6/2012 | Karino et al. | |
| 2013/0285633 | A1 * | 10/2013 | Johnson | H02M 3/156 323/282 |

FOREIGN PATENT DOCUMENTS

| | | |
|---|---|---|
| JP | 06165485 A | 6/1994 |
| JP | 07283367 A | 10/1995 |
| JP | 09232522 A | 9/1997 |
| JP | 2001007121 A | 1/2001 |
| JP | 2001007171 A | 1/2001 |
| JP | 2003039160 A | 2/2003 |
| JP | 2004023894 A | 1/2004 |
| JP | 2006121808 A | 5/2006 |
| JP | 2008153636 A | 7/2008 |
| JP | 5104878 B2 | 12/2012 |

OTHER PUBLICATIONS

International Search Report issued in PCT/JP2014/003021, dated Sep. 2, 2014. English translation provided.

Japanese Office Action issued in Japanese counterpart application No. JP2015-522530, dated Dec. 1, 2015. English tanslation provided.

* cited by examiner

SEMICONDUCTOR DEVICE, SWITCHING POWER SUPPLY CONTROL IC, AND SWITCHING POWER SUPPLY DEVICE

CROSS-REFERENCE TO RELATED APPLICATIONS

This application is a continuation of International Application No. PCT/JP2014/003021, filed on Jun. 6, 2014, which is based on and claims priority to Japanese Patent Application No. JP 2013-129656, filed on Jun. 20, 2013. The disclosure of the Japanese priority application and the PCT application in their entirety, including the drawings, claims, and the specification thereof, are incorporated herein by reference.

BACKGROUND

1. Field of the Invention

The present invention relates to a semiconductor device, a switching power supply control IC, and a switching power supply device in which the switching power supply control IC is mounted.

2. Related Art

A switching power supply control IC (hereafter referred to as a "control IC") is a dedicated IC for controlling an individual high breakdown voltage switching transistor. The IC forms its own power supply in an operating state by causing a high breakdown voltage switching transistor to operate, but a supply of starting current from a starting circuit is necessary when starting up. Normally, the starting circuit is integrated on the same semiconductor substrate as the control IC, because of which a reduction in part quantity and a simplification of the power supply system is realized.

The starting current is a rectified input alternating current signal of 100 to 240V AC, and in order to supply the starting current to the starting circuit, a normally-on element upstream of the starting circuit needs a breakdown voltage of 450V or more. As the normally-on element is monolithically integrated with the switching power supply control IC, the normally-on element is realized as a lateral high breakdown voltage junction field effect transistor (lateral high breakdown voltage JFET). The design specifications of a switching power supply device are determined in accordance with the current drive capability of the element.

FIG. 22 is a circuit diagram showing the configuration of an existing switching power supply device 700. As shown in FIG. 22, the switching power supply device 700 incorporates an unshown resistor (hereafter referred to as a brown-out resistor) for detecting a drop in AC input voltage inside a starting circuit 41 of a control IC 31. See Japanese Patent Application Publication No. JP-A-2008-153636 (also referred to herein as "PTL 1"). Although a resistor 91 is omitted in PTL 1, it is shown in FIG. 22. The resistor 91 is an overvoltage control resistor that reduces overvoltage before the voltage is input into a VH terminal 32, so that no overvoltage such as an ESD surge or lightning surge is applied to the VH terminal 32.

FIG. 23 is a circuit diagram showing the configuration of the starting circuit 41 mounted in the switching power supply device of FIG. 22. As shown in FIG. 23, the starting circuit 41 includes a VH terminal (high voltage input terminal) 61, a BO terminal (brown-out input terminal) 62, an on/off terminal (on/off signal input terminal) 63, and a VCC terminal (power supply voltage terminal) 64. The VH terminal 61 and VCC terminal 64 are connected respectively to the VH terminal 32 and a VCC terminal 35 of the control IC 31. The on/off terminal 63 is connected to an undervoltage lockout circuit 42.

Also, the starting circuit 41 includes a starting element 65. The starting element 65 includes two high breakdown voltage JFETs 81 and 82 and a series resistor circuit formed of two resistors 73 and 74. The BO terminal 62 is connected to an intermediate node of the series resistor circuit formed of the resistors 73 and 74. The series resistor circuit formed of the resistors 73 and 74 is connected to the VH terminal 61.

Also, the BO terminal 62 is connected to a non-inversion input terminal (+terminal) of a BO comparator 44. That is, voltage that is voltage input into the VH terminal 61 and divided by the resistors 73 and 74 is input into the non-inversion input terminal of the BO comparator 44.

The two JFETs 81 and 82 are normally-on junction field effect transistors, and the gate terminals thereof are grounded. Also, the drain terminals of the two JFETs 81 and 82 are both connected to the VH terminal 61. The source terminal of the first JFET 81 is connected to the source terminal of a first PMOS transistor 67 and the source terminal of a second PMOS transistor 69.

The gate terminal of the first PMOS transistor 67 is connected to both the gate terminal and drain terminal of the second PMOS transistor 69. The drain terminal of the second PMOS transistor 69 is connected to a load 70. A first NMOS transistor 68 is connected between the drain terminal of the first PMOS transistor 67 and the VCC terminal 64.

The gate terminal of the first NMOS transistor 68 is connected via a resistor 66 to the source terminal of the second JFET 82. Also, the gate terminal of the first NMOS transistor 68 is connected to the drain terminal of a second NMOS transistor 71. The gate terminal of the second NMOS transistor 71 is connected to the on/off terminal 63. The source terminal of the second NMOS transistor 71 is grounded. Also, the gate terminal of the second NMOS transistor 71 is grounded via a resistor 72.

The starting circuit 41 with this kind of configuration is such that the current flowing through the second PMOS transistor 69 is determined by the voltage-current characteristics of the second PMOS transistor 69 and the impedance of the load 70. The second PMOS transistor 69 and first PMOS transistor 67 are current mirror-connected. Further, while the W/L value of the second PMOS transistor 69 is 1, the W/L value of the first PMOS transistor 67 is 100. W and L are the channel width and channel length respectively. Consequently, current 100 times larger than that of the second PMOS transistor 69 flows through the first PMOS transistor 67. W and L are the channel width and channel length respectively.

The first NMOS transistor 68 functions as a switch that switches between an on-state and an off-state based on an on/off signal supplied via the on/off terminal 63 from the undervoltage lockout circuit 42. When the on/off signal is in a Low state, the second NMOS transistor 71 switches to an off-state, and a high voltage is input into the gate terminal of the first NMOS transistor 68, because of which the switch switches to an on-state. Owing to the switch switching to an on-state, current is supplied from the starting circuit 41 to the VCC terminal 35 of the control IC 31 when starting up the power supply.

Meanwhile, when the on/off signal is in a High state, the second NMOS transistor 71 switches to an on-state, and the gate voltage of the first NMOS transistor 68 becomes zero, because of which the switch switches to an off-state. Consequently, the current path between the VH terminal 61 and VCC terminal 64 is interrupted, because of which the supply of current from the starting circuit 41 to the VCC terminal 35 is stopped.

In order to clearly show the characteristics of a semiconductor device, the semiconductor device is shown in FIG. 24 with metal wiring, an interlayer dielectric, and a LOCOS oxide film omitted. The semiconductor device configures the starting element 65. Also, hatching indicating a cross-section is omitted from FIG. 25 in order to facilitate viewing of the drawings.

As shown in FIG. 24 and FIG. 25, a p-type well region that forms a gate region 102 is selectively formed in a surface layer of a p-type substrate 101. The gate region 102 forms a channel region in which a channel is formed. Also, a low concentration n-type well region that forms a drift region 103 is selectively formed in a surface layer of the p-type substrate 101 so as to penetrate by a predetermined distance into one portion of the gate region 102. Furthermore, a high concentration n-type well region that forms a source region 104 is selectively formed in, for example, eight places in a surface layer of the p-type substrate 101 into which the drift region 103 penetrates.

A high concentration n-type well region that forms a drain region 105 is selectively formed in a place in a surface layer of the p-type substrate 101 distanced from the source region 104, opposing the source region 104. The source region 104 is formed on the circumference of a circle at regular intervals from the drain region 105.

A gate polysilicon electrode 107 is formed as a control electrode so as to straddle the gate region 102 and drift region 103 in a place in which the drift region 103 comes into contact with the gate region 102. An interlayer dielectric 109 is provided on a LOCOS oxide film 108, the gate polysilicon electrode 107, the gate region 102, the source region 104, and the drain region 105.

A high breakdown voltage high resistance element 121 is embedded in the interlayer dielectric 109 in a region between the drain region 105 and the gate region 102 or source region 104. Metal wiring that forms gate electrode wiring 106, metal wiring that forms drain electrode wiring 110, metal wiring that forms first source electrode wiring 112, metal wiring that forms second source electrode wiring 113, metal wiring that forms first resistor connection wiring 122, and metal wiring that forms second resistor connection wiring 123, are formed on the interlayer dielectric 109.

The gate electrode wiring 106 is electrically connected to the gate region 102 and gate polysilicon electrode 107 via a gate contact portion 114 and polysilicon contact portion 115 that penetrate the interlayer dielectric 109.

The drain electrode wiring 110 is electrically connected to the drain region 105 via a drain contact portion 116 that penetrates the interlayer dielectric 109. As the drain region 105 is a drain region common to the first JFET 81 and second JFET 82, the drain electrode wiring 110 is connected to the VH terminal 61 of the starting circuit 41.

The first source electrode wiring 112 is electrically connected to seven source regions 104. The second source electrode wiring 113 is electrically connected to the other source region 104.

Also, it is described in Japanese Patent Application Publication No. JP-A-2006-121808 (also referred to herein as "PTL 2") that when the switching power supply IC is installed in a product (switching power supply), a protective circuit including a thyristor or the like is connected to the exterior of the switching power supply control IC in order to protect the switching power supply control IC from overvoltage, such as lightning surge voltage, applied from the AC input line.

Also, in Japanese Patent Application Publication Nos. JP-A-2003-39160 and JP-A-2004-23894 (also referred to herein as "PTL 3" and "PTL 4", respectively), again in order to protect the IC from overvoltage, it is described that a circuit controlling switching operation is incorporated by providing a voltage monitoring function inside the switching power supply control IC.

In PTL 1, however, the resistor 91, which has an overvoltage restricting effect, is attached to the exterior of the control IC 31 so that overvoltage such as ESD surge or lightning surge is not directly applied to the VH terminal. Therefore, assembly time is required when fabricating the switching power supply device, and the quantity of parts increases. Furthermore, the device size increases.

Also, in PTL 2 to 4, it is necessary to exercise extreme care with regard to the assembly environment of the switching power supply device, or alternatively, as heretofore described, to reduce overvoltage by adding an external protective part having a resistance component, such as an external resistor or thyristor, so that overvoltage such as electrostatic discharge (ESD) is not applied to the input terminal of the starting element. In either case, an external part is necessary, because of which the cost and mounting area of the switching power supply device increase.

Also, when a voltage monitoring function is provided inside the control IC 31, as shown in PTL 4, the circuit controlling switching operation is such that the control function comes into effect under conditions wherein switching operation is established, because of which resistance to static electricity is inadequate at a stage before installation in a power supply system. In the same way, the restricting function does not combat overvoltage generated at a stage such as a standby state before switching operation is established.

SUMMARY OF INVENTION

In order to resolve the heretofore described problems, an object of the invention is to provide a semiconductor device incorporating an overvoltage restricting function and having high overvoltage resistance, and a switching power supply control IC and switching power supply device in which the semiconductor device is used.

In order to achieve the object of the invention, a semiconductor device according to a first aspect of the invention is characterized by including a junction field effect transistor formed in an upper portion of a semiconductor substrate, a dielectric provided on the junction field effect transistor, relay wiring, provided on the dielectric, to which voltage is applied from the exterior, and a first resistor element, connected between the drain of the junction field effect transistor and the relay wiring, provided inside the dielectric.

According to the invention, a semiconductor device having high overvoltage resistance can be provided by a resistor that restricts overvoltage (surge voltage) being inserted between the input terminal and drain of a JFET.

Also, it is possible to provide a low cost switching power supply control IC and switching power supply device, which occupy a small area, by using a semiconductor device including an overvoltage restricting resistor element.

BRIEF DESCRIPTION OF DRAWINGS

FIGS. 1A and 1B are main portion configuration diagrams of a semiconductor device according to a first embodiment of the invention, wherein FIG. 1A is a main portion plan view, and FIG. 1B is an equivalent circuit diagram of a JFET of FIG. 1A;

FIGS. 2A-2C are main portion configuration diagrams of a resistor element, wherein FIG. 1A is a top plan view showing a circular form, FIG. 1B is a top view showing the form of a spiral form resistor element, and FIG. 1C is a top plan view showing the form of a plate form resistor element;

FIGS. 13A and 13B are main portion sectional views of FIG. 9, wherein FIG. 13A is a main portion sectional view showing a sectional structure along an A-A line of FIG. 11, and FIG. 13B is a main portion sectional view showing a sectional structure along a B-B line of FIG. 11;

FIGS. 14A and 14B are main portion sectional views showing a modification example of the semiconductor device of FIG. 9, wherein FIG. 14A is a main portion sectional view showing a sectional structure in the same position as the A-A line of FIG. 11, and FIG. 14B is a main portion sectional view showing a sectional structure in the same position as the B-B line of FIG. 11;

FIGS. 16A and 16B are main portion configuration diagrams of a semiconductor device according to a third embodiment of the invention, wherein FIG. 16A is a main portion plan view, and FIG. 16B is a main portion sectional view showing a sectional structure along a C-C line of FIG. 16A;

FIGS. 20A and 20B are main portion configuration diagrams of a semiconductor device according to a fifth embodiment of the invention, wherein FIG. 20A is a main portion plan view, and FIG. 20B is a main portion sectional view showing a sectional structure along a C-C line of FIG. 20A;

FIGS. 25A-25C are main portion sectional views of FIG. 24, wherein FIG. 25A is a main portion sectional view showing a sectional structure along an X-X line of FIG. 24, FIG. 25B is a main portion sectional view showing a sectional structure along a Y-Y line of FIG. 24, and FIG. 25C is a main portion sectional view showing a sectional structure along a Z-Z line of FIG. 24.

DETAILED DESCRIPTION

Figure 1A:
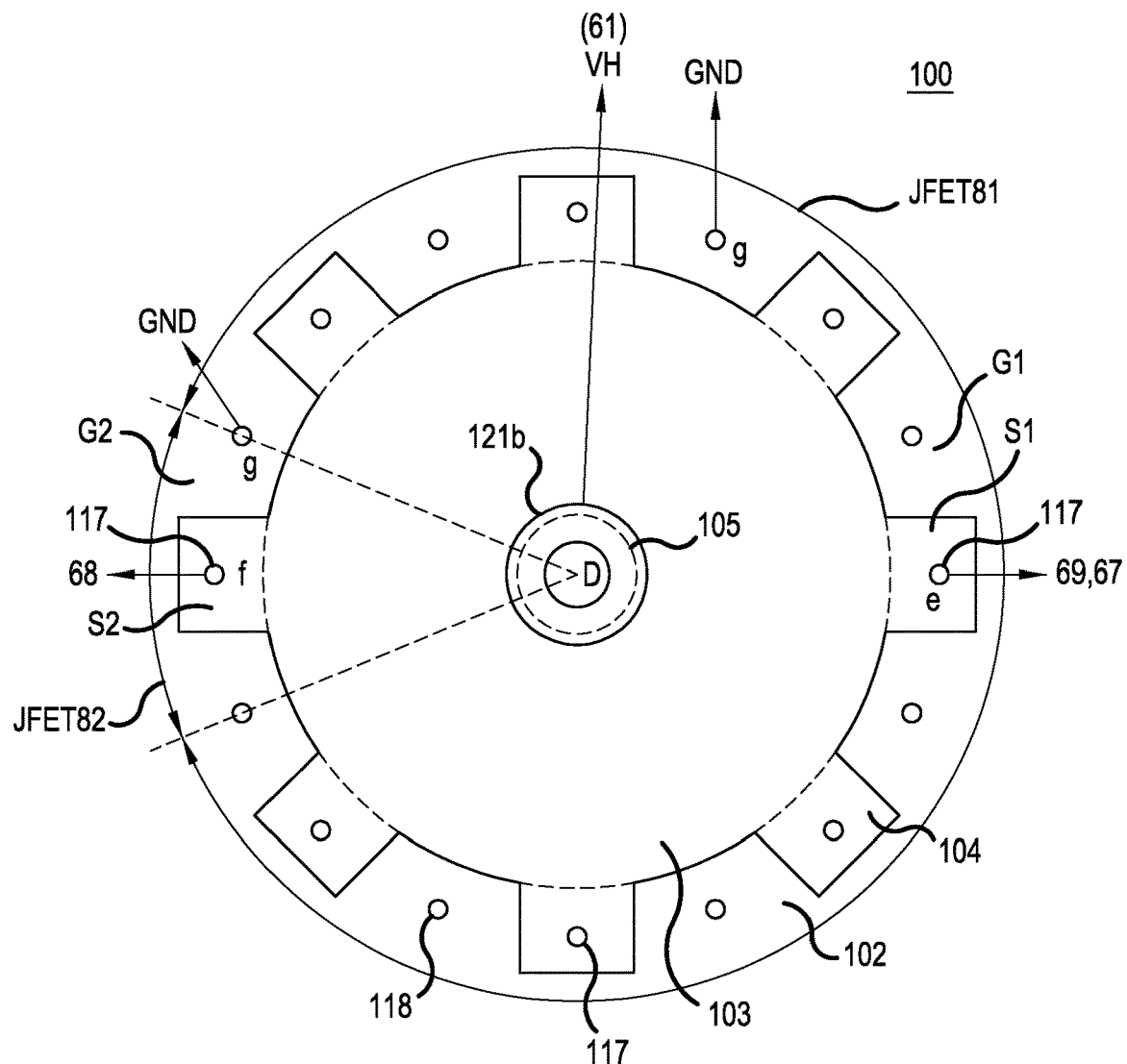

Hereafter, a detailed description will be given, referring to the drawings, of a semiconductor device, and a switching power supply control IC and switching power supply device in which the semiconductor device is used, according to embodiments of the invention.

In the following description of first to sixth embodiments, a case wherein a first conductivity type is p-type and a second conductivity type n-type is taken as an example, but the opposite relationship between conductivity types may also be selected, taking the first conductivity type to be n-type and the second conductivity type p-type.

For ease of viewing and ease of understanding, the attached drawings described in the first to sixth embodiments are not drawn to an accurate scale or dimensional ratio. Provided that there is no deviation from the scope of the invention, the invention is not limited to the descriptions of the first to sixth embodiments.

Figure 1B:
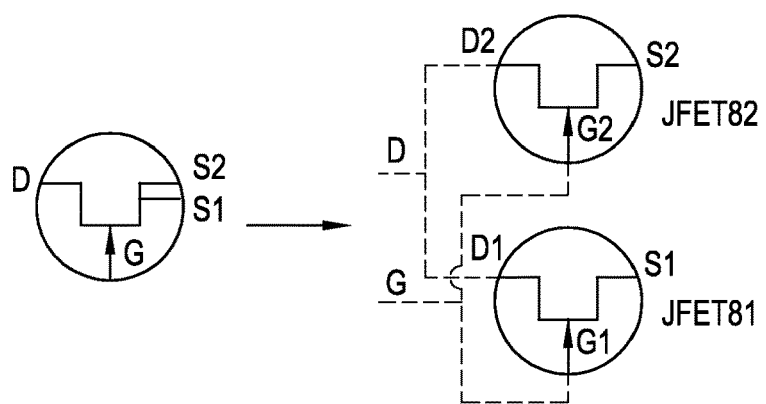

(First Embodiment) FIG. 1 shows a resistor element 121*b* and the JFETs 81 and 82 configuring a semiconductor device 100 according to the first embodiment of the invention, but an electrode formed in an upper portion is not shown.

Also, in FIG. 1(*b*), the JFETs 81 and 82 are such that a drain D is shared while a source S is divided into two. Therefore, the two JFETs 81 and 82 are shown as an equivalent circuit, as shown to the right of the arrow. The JFETs 81 and 82 are normally-on junction field effect transistors.

As shown in FIG. 2, the resistor element 121*b* is formed from above the drain region 105 to above the drift region 103 in the vicinity of the drain region 105, but can also be formed only above the drain region 105.

In FIG. 1 to FIG. 6, j, k, e, f, and g indicate the positions of contact holes, while reference signs 126, 126*a*, 117, and 118 indicate contact holes or contact portions (regions connected by contact holes). j, k, and g correspond to reference signs 126, 126*a*, and 118 respectively, while e and f each correspond to reference sign 117, which is in two places. Reference sign 117 is a contact hole or contact portion connected to the source region 104, wherein the position corresponding to the JFET 81 is e, while the position corresponding to the JFET 82 is f. Reference sign 118 is a contact hole or contact portion connected to the gate region 102.

As shown in FIG. 6, the resistor element 121*b* is mainly formed inside the interlayer dielectric 109 above the second conductivity type (n-type) drain region 105 in the semiconductor device 100 according to the first embodiment of the invention. The resistor element 121b is formed to in the region of, for example, several tens of Ohms to 200 Ohms. A JFET is configured of the JFET 81 and JFET 82, and the positions of contact portions connected to the electrode of each portion are also shown in the drawings.

Figure 3:
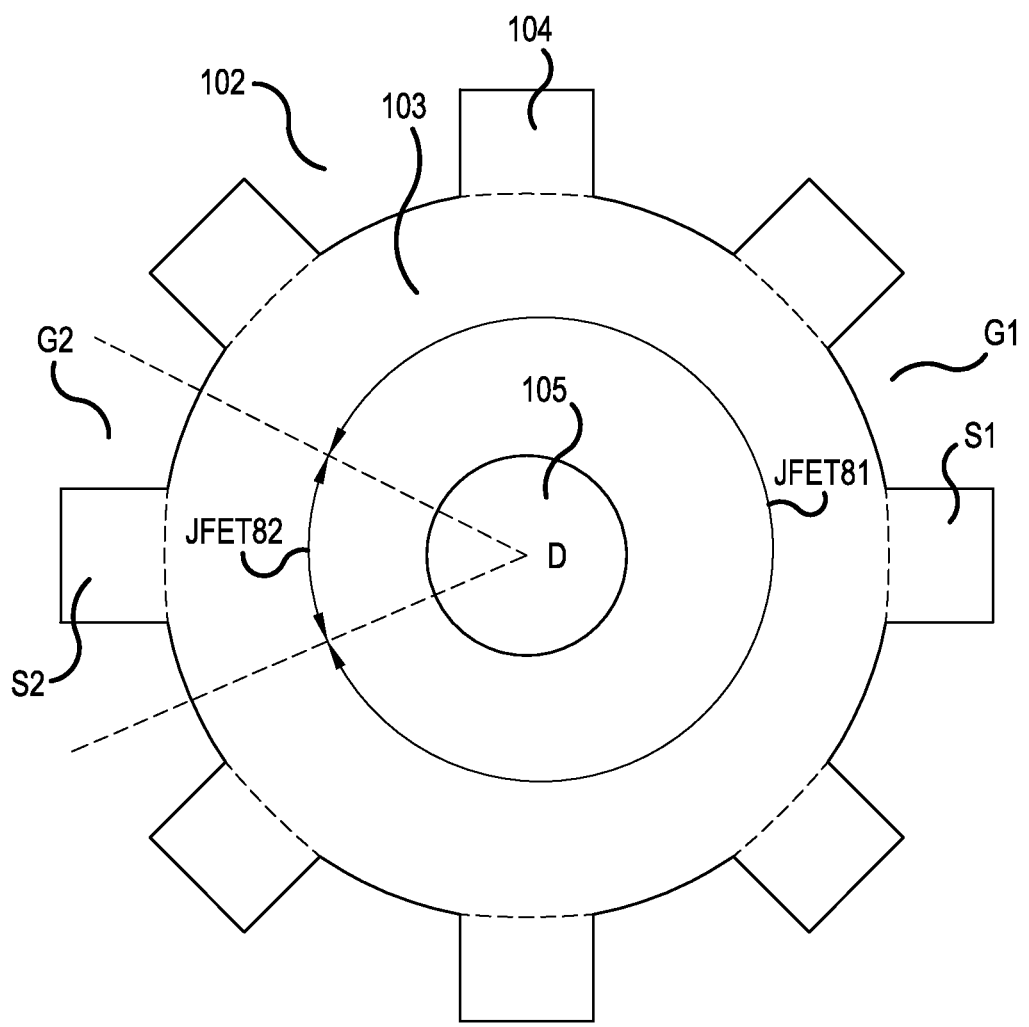
FIG. 3 is a main portion plan view showing a simplification of FIG. 1 A.

As shown in FIG. 3, the second conductivity type (n-type) source region 104 exists in eight places, of which seven are the source region of the JFET 81, and one is the source region of the JFET 82.

Figure 4:
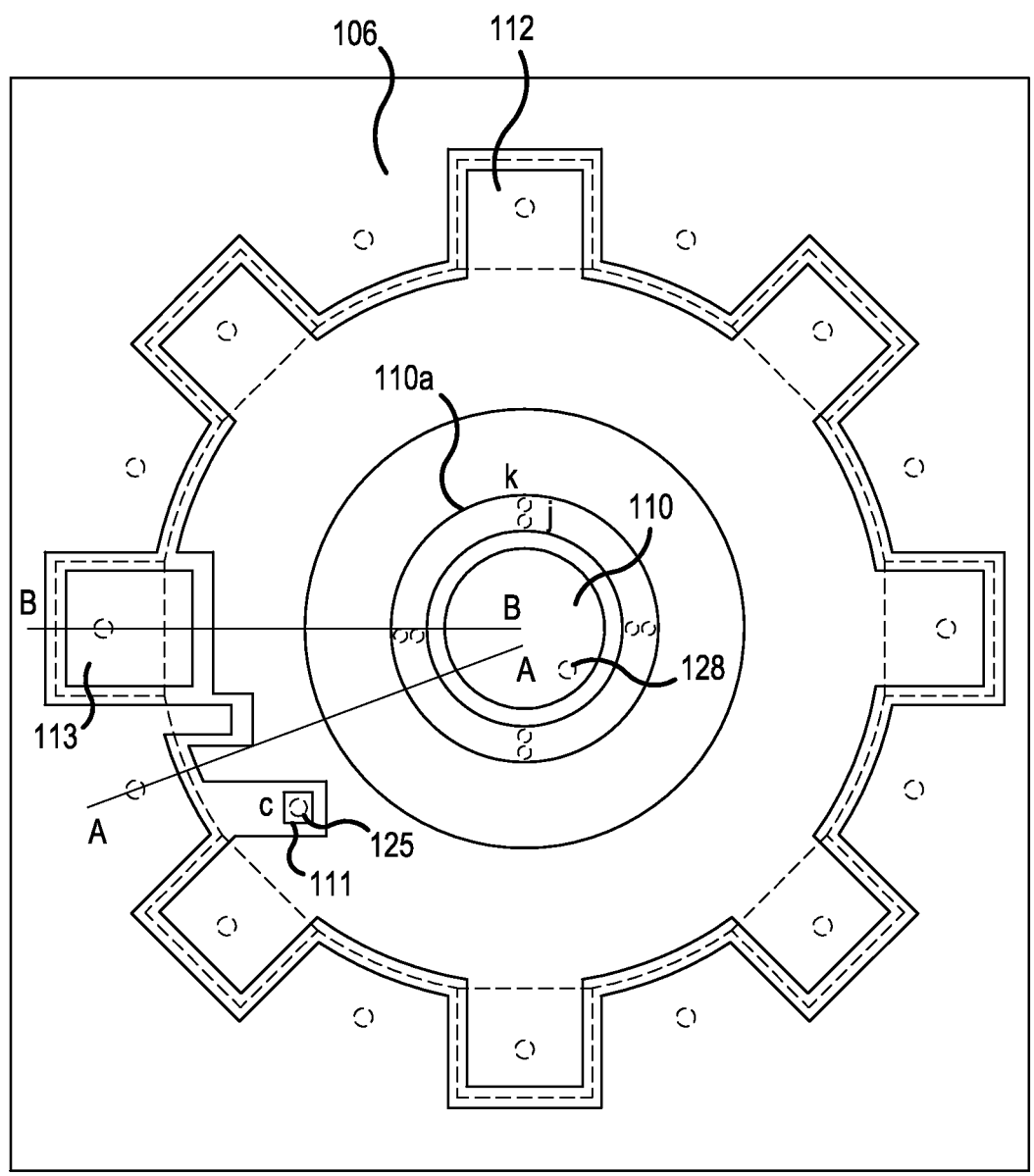
FIG. 4 is a main portion plan view of first layer electrodes of the semiconductor device of FIG. 1A.

Of a first layer of metal electrodes, the gate electrode wiring 106 surrounds the first and second source electrode wiring 112 and 113, and the drain electrode wiring 110 is disposed above the drain electrode 105 in a central portion, as shown in FIG. 4. Also, an electrode connected to the resistor element 121b is also disposed. These electrodes are connected to the relevant regions via the contact portions 126 and 110a corresponding to j and k.

Figure 5:
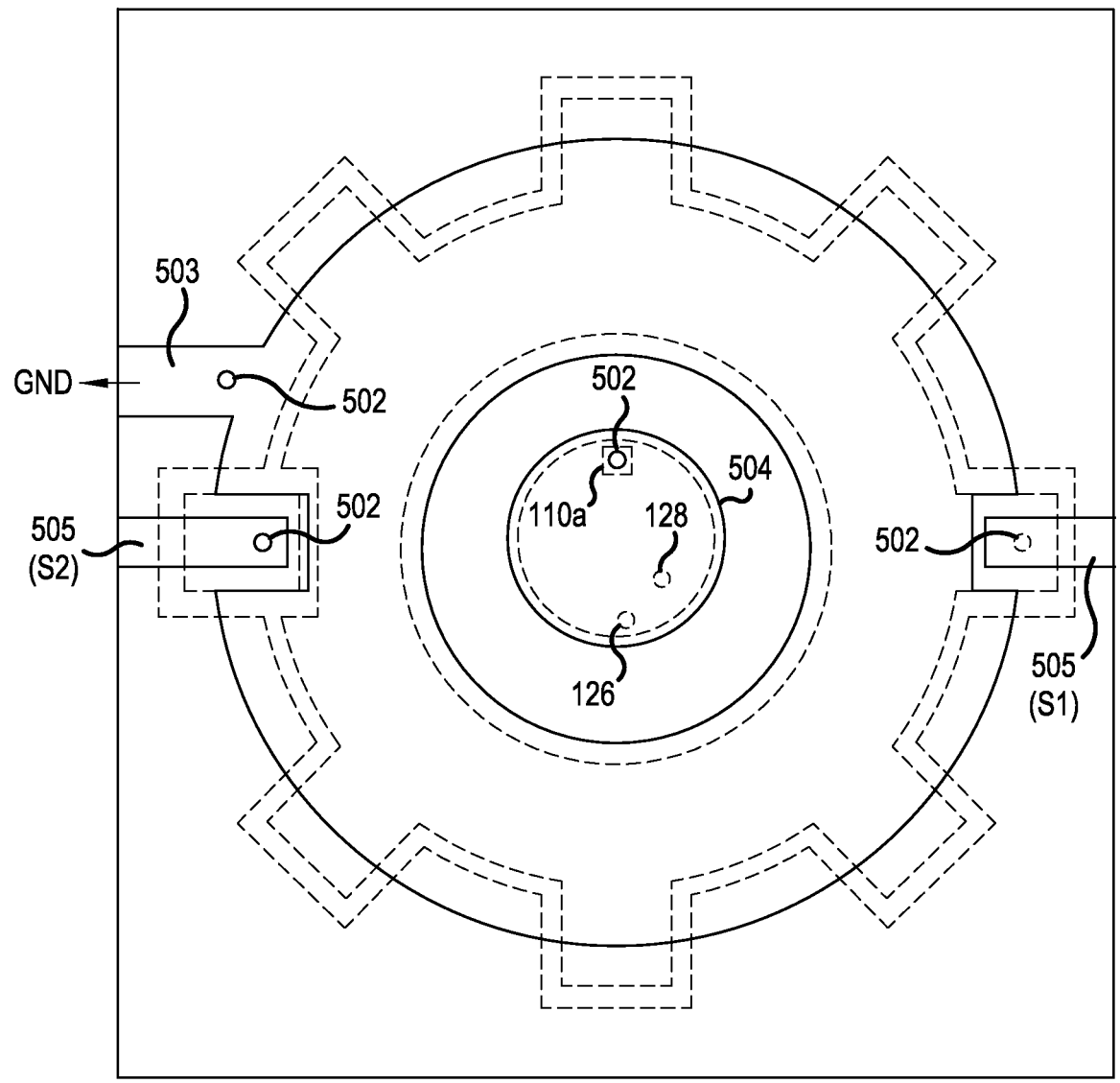
FIG. 5 is a main portion plan view of second layer electrodes of the semiconductor device of FIG. 1A.

As shown in FIG. 5, a second layer of metal electrodes (wiring 503 and 504) is formed across a second layer interlayer dielectric formed above the first layer of metal electrodes (the gate electrode wiring 106, drain electrode wiring 110, and relay wiring 110a), and is connected to the first layer of electrodes via contact portions.

Figure 6A:
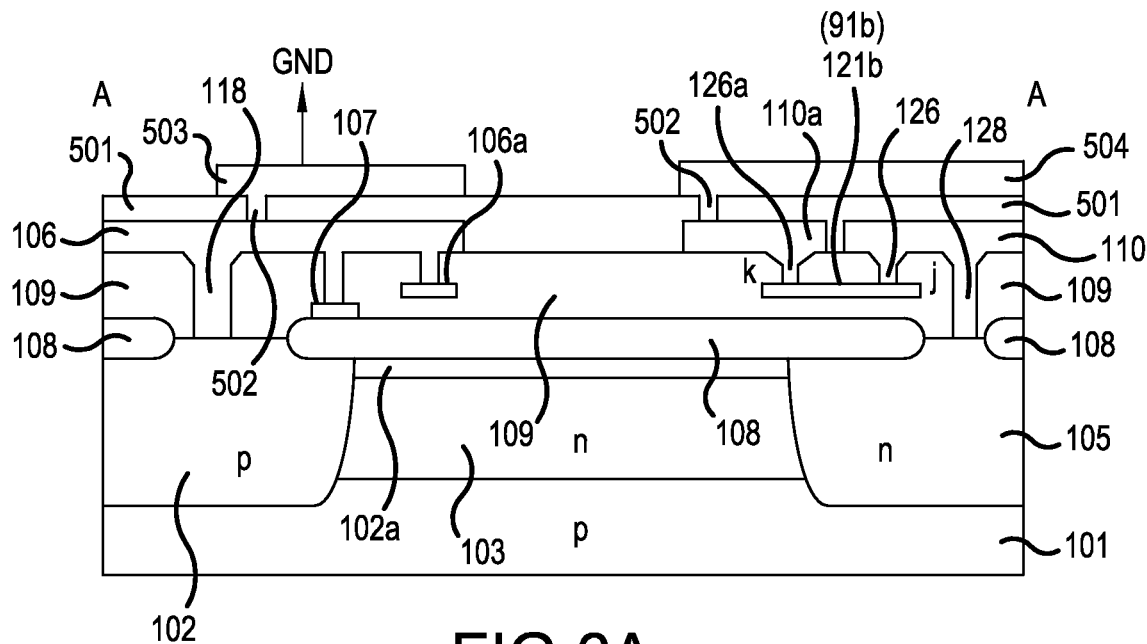
FIG. 6A is a main portion sectional view showing a sectional structure along an A-A line of FIG. 4.
Figure 6B:
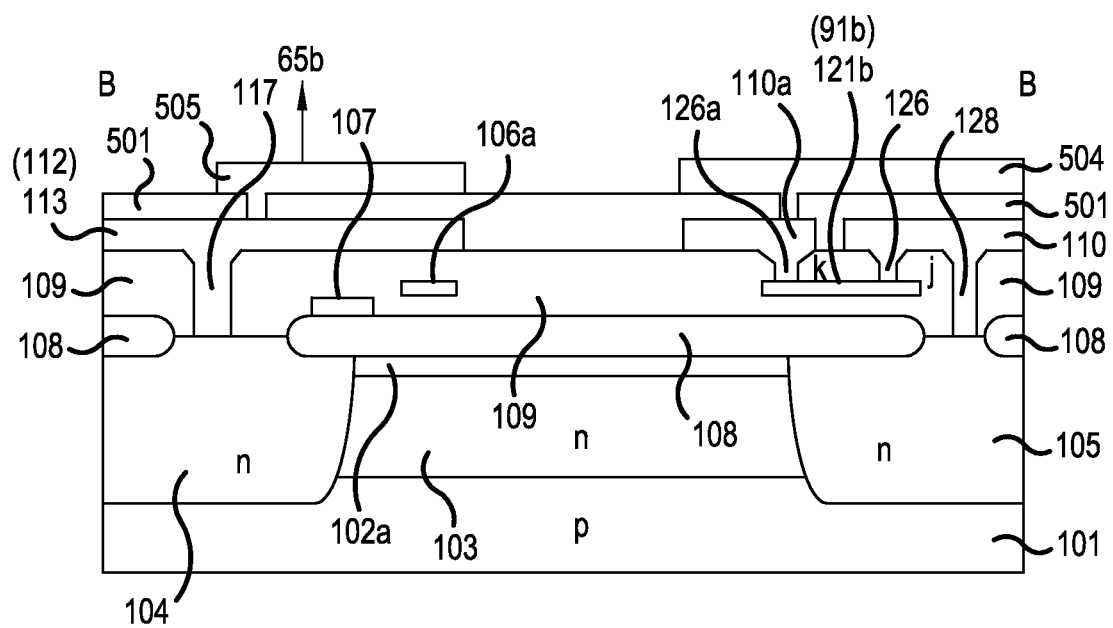
FIG. 6B is a main portion sectional view showing a sectional structure along a B-B line of FIG. 4.

As shown in the sectional views in FIG. 6, wherein the center of the drain region 105 is at the right end, each region (the gate region 102, source region 104, and drain region 105) and the relevant metal electrode (the gate electrode wiring 106, drain electrode wiring 110, and second source electrode wiring 113) are connected via the contact portions (118, 117, and 128). Hatching indicating a cross-section is omitted from FIGS. 6(a) and 6(b) in order to facilitate viewing of the drawings.

The drain region 105 shown at the right end of FIG. 6 is disposed in FIG. 1 in a central portion of the drift region 103 in a surface layer of the p-type substrate 101 so as to be in contact with the drift region 103. The LOCOS oxide film 108, with a thickness of in the region of 6,000 Å, is formed above the drift region 103, as shown in FIG. 6. The interlayer dielectric 109 is provided on the LOCOS oxide film 108, gate region 102, and drain region 105.

The drain region 105 need not be formed. In this case, the drift region 103 is connected to the drain electrode wiring 110.

Figure 7:
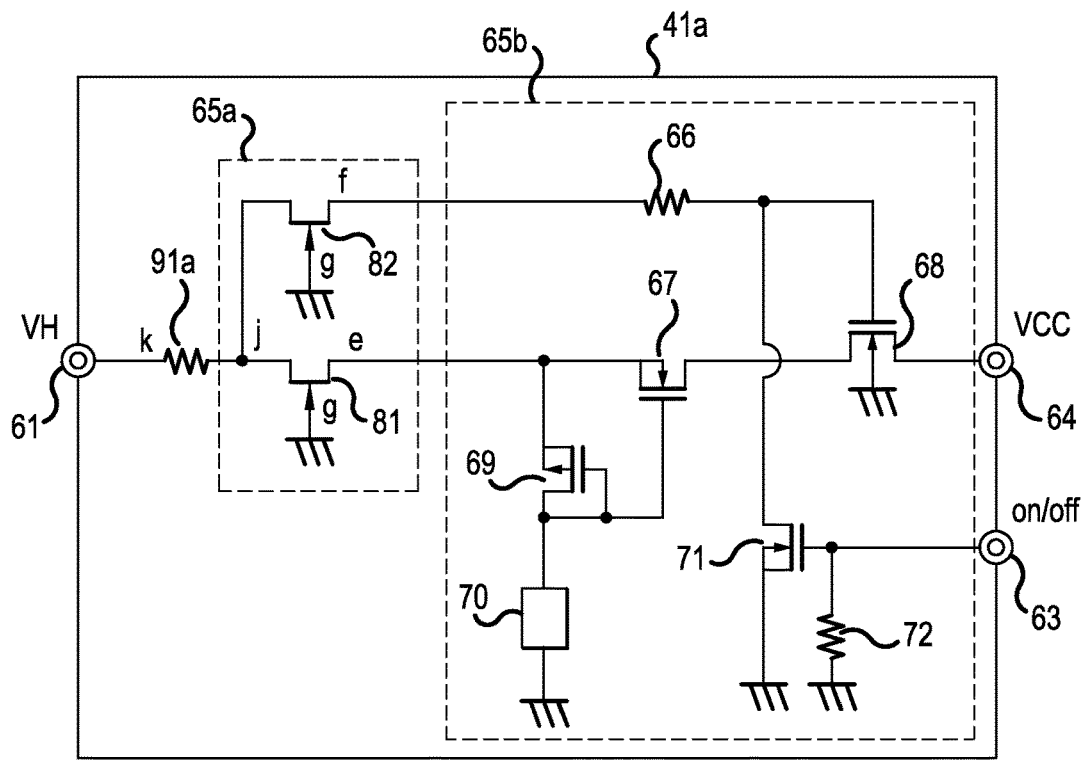
FIG. 7 is a main portion circuit diagram of a starting circuit in which the semiconductor device of FIG. 1A is used.

As shown in FIG. 7, a starting circuit 41a is such that a starting element 65a, a resistor 91a, and a post-starting stage circuit 65b are integrated on the same semiconductor substrate. The resistor 91a is shown as the resistor element 121b in the semiconductor device 100.

The VH terminal 61 is connected via the resistor 91a to the JFETs 81 and 82. Also, the two sources of the JFETs 81 and 82 are connected to the post-starting stage circuit 65b. The source of the JFET 82 is connected via the resistor 66 to the gate of the NMOS transistor 68, while the source of the JFET 81 is connected via the PMOS transistor 67 to the drain of the NMOS transistor 68.

Next, using FIG. 1 to FIG. 6, a description will be given of the JFETs 81 and 82 and resistor element 121b of the semiconductor device 100 according to the first embodiment of the invention.

As shown in FIG. 6, the first conductivity type (p-type) gate region 102 is selectively formed in a surface layer of the p-type substrate (first conductivity type (p-type) semiconductor substrate) 101. Also, the second conductivity type (n-type) drift region 103, formed of an n-type well region of a low impurity concentration in comparison with that of the second conductivity type (n-type) drain region 105, is formed in a surface layer of the p-type substrate 101. A surface layer of the drift region 103 includes a gate region 102a formed so as to be in contact with the first conductivity type (p-type) gate region 102. The gate region 102a is a region for promoting depletion of the drift region 103 from a vertical direction. The gate region 102a can be provided as necessary.

Figure 2A:
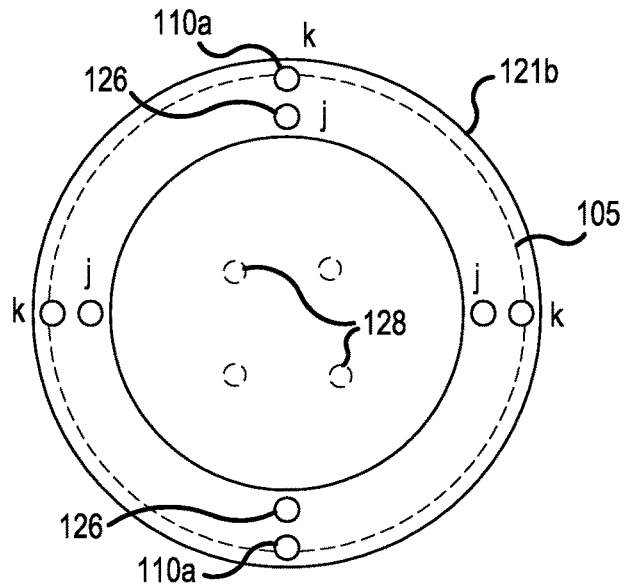
Figure 2B:
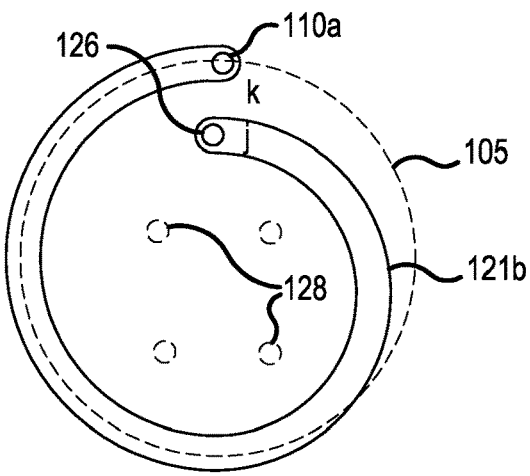
Figure 2C:
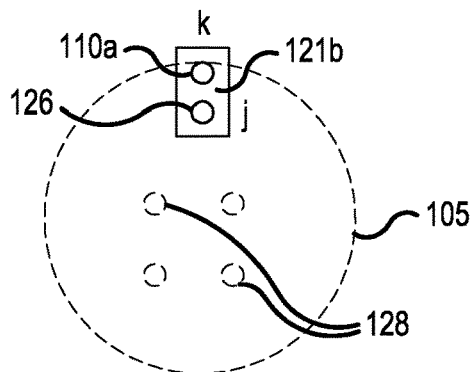

The kind of ring form resistor element 121b shown in the center of FIG. 1 is embedded inside the interlayer dielectric 109 above the drain region 105. The thickness of the interlayer dielectric 109 between the resistor element 121b shown in FIG. 6 and the LOCOS oxide film 108, which has a thickness of in the region of 6,000 Å, is 2,000 Å. The resistor element 121b is made of a thin film resistor such as polysilicon or a chrome silicon (CrSi) alloy, and the planar form thereof is formed to be circular, as shown in FIG. 1 and FIG. 2(a). Of course, the resistor element 121b may also be formed in a spiral form or plate form, as in FIG. 2(b) and FIG. 2(c).

Metal wiring such as the gate electrode wiring 106, first and second source electrode wiring 112 and 113, relay wiring 110a, and drain electrode wiring 110 are formed on the interlayer dielectric 109.

The gate electrode wiring 106 shown in FIG. 6(a) is formed on the gate region 102 so as to surround the source region 104 and drift region 103 shown in FIG. 6(b) (refer to the gate electrode wiring 106 shown in the peripheral portion of FIG. 4). The gate electrode wiring 106 is electrically connected to the gate region 102 via the contact hole 118 penetrating the interlayer dielectric 109. The gate electrode wiring 106 is grounded.

As shown in FIG. 6(a), the gate electrode wiring 106 is formed so as to jut onto the interlayer dielectric 109. Therefore, the intensity of an electrical field generated in a boundary portion of the drift region 103 and gate region 102 is relaxed, and the breakdown voltage of the semiconductor device 100 can be further increased. Furthermore, an effect of further increasing breakdown voltage is produced by connecting a leading end portion of the gate electrode wiring 106 and a field plate 106a embedded in the interlayer dielectric 109 and formed of, for example, polysilicon.

The drain electrode wiring 110 is electrically connected to the drain region 105 via the contact portion (contact hole) 128 penetrating the interlayer dielectric 109. The drain electrode wiring 110 is electrically connected to a pad 504 via the contact portion 126, the resistor element 121b, the contact portion 126a, the relay wiring 110a, and a via portion 502.

A second interlayer dielectric 501 is formed on the gate electrode wiring 106, relay wiring 110a, and drain electrode wiring 110. The gate electrode wiring 106 and relay wiring 110a are connected to wiring 503 and the pad 504 respectively via the via portion 502. The gate electrode wiring 106 is grounded. Also, the first and second source electrode wiring 112 and 113 are connected via wiring 505 (S1 and S2) to the post-starting stage circuit 65b of the starting circuit 41a, and the source of the NMOS transistor 68 of the post-starting stage circuit 65b is connected to the VCC terminal 64.

The semiconductor device 100 according to the first embodiment of the invention is such that roles are divided so that the junction of the gate region 102 and drift region 103 is responsible for a structure for increasing breakdown voltage, while the source region 104 is responsible for a structure for a large current, because of which it is possible to strike a balance between increasing breakdown voltage and reducing on-state resistance. When voltage is applied to the drain region 105, drain current flows radially. The source region 104 is biased to a positive potential, and when the potential rises and reaches a certain potential, the drift region 103 is cut off by a depletion layer, and the drain current is interrupted. The semiconductor device 100 according to the first embodiment of the invention is designed to have breakdown voltage of, for example, 500V or more between the drain and source, mainly owing to the junction of the gate region 102 and drift region 103. The same also applies to semiconductor devices according to the second to sixth embodiments described hereafter.

Figure 8:
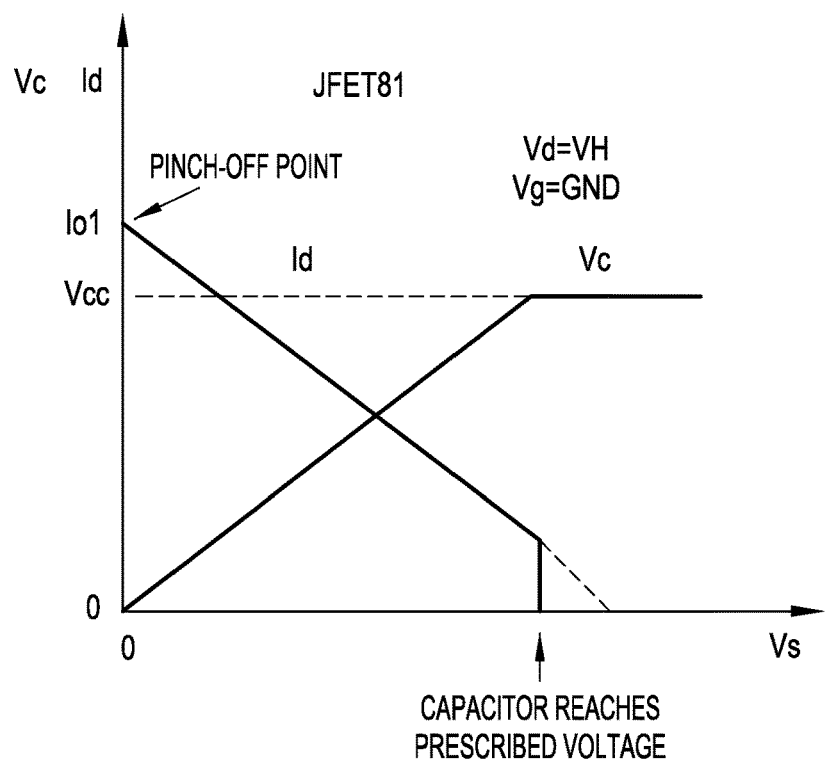
FIG. 8 is a diagram showing the relationship between a source current Is, a capacitor voltage Vc, and a source voltage Vs for the JFET of the semiconductor device of FIG. 1A.
Figure 21:
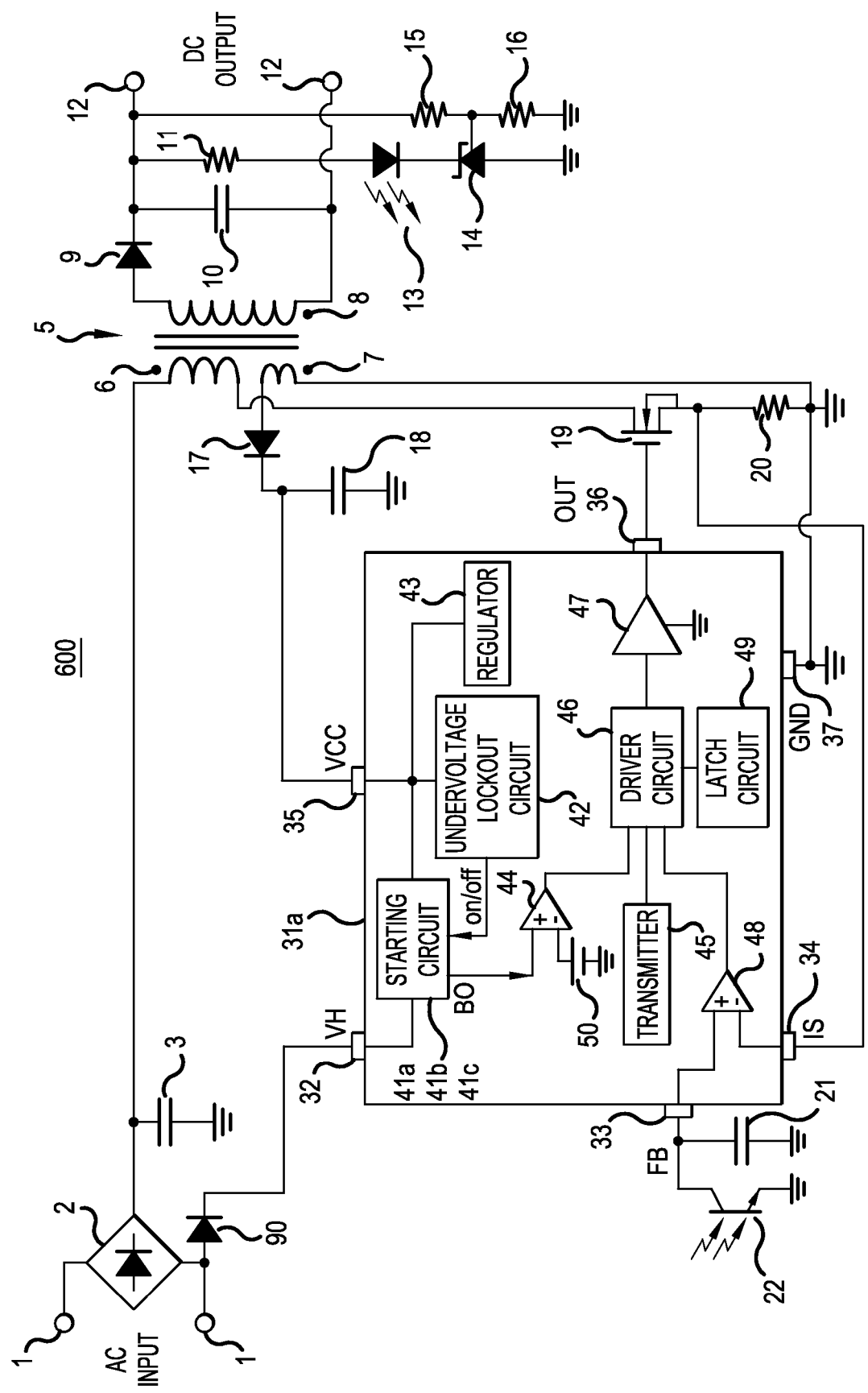
FIG. 21 is a main portion circuit diagram of a switching power supply device according to the fourth embodiment of the invention.

Using FIG. 8, a description will be given of an operation of the starting element 65a of FIG. 7. The gate region 102, which is a gate, is grounded. When voltage is applied from the VH terminal 61 via 91a to the drain region 105 (D) of the JFETs 81 and 82, a depletion layer spreads inside the drift region 103 and source region 104. As the impurity concentration of the source region 104 is higher than that of the drift region 103, the extent of depletion is smaller than in the drift region. Therefore, a large drain current Id (=Io) flows when Vs is 0V. The drain current Id flows out from the VCC terminal 64 via the source region 104 (S1 and S2), and charges a capacitor 18 shown in FIG. 21, to be described hereafter. When the voltage of the capacitor 18 rises owing to the charging, the source voltage Vs also rises. When the source voltage Vs rises, the reverse bias of the p-n junction of the gate region 102 and source region 104 increases, depletion intensifies in the drift region 103, and the drain current Id decreases. On the capacitor 18 reaching a prescribed voltage, the NMOS transistor 68 connected in series with the JFET 81 is turned off, and the drain current Id stops. At the point at which the capacitor 18 reaches the prescribed voltage, the starting circuit 41a stops working, and a control IC 31a in which the semiconductor device 100 is integrated, shown in FIG. 21 to be described hereafter, is such that each circuit operates with the voltage of the capacitor 18, charged by current supplied via a rectifying diode 17 from an auxiliary coil 7, as a power supply.

Next, a description will be given of a case wherein an overvoltage is applied to the VH terminal 61 shown in FIG. 7. When an overvoltage is applied to the VH terminal 61, an overcurrent flows from the pad 504 connected via bonding wire to the VH terminal 61 of the starting circuit 41a, via the via portion 502, relay wiring 110a, and contact portion 126a, into the resistor element 121b. The overcurrent flowing into the resistor element 121b flows from the contact portion 126, through the drain electrode wiring 110, and into the drain region 105 via the contact portion 128, while the potential thereof decreases. As overvoltage is always applied to the drain region 105 through the resistor element 121b in this way, voltage reduced (restricted) by the resistor element 121b below that in a case wherein overvoltage is applied directly to the drain region 105 is applied, because of which the overvoltage resistance of the semiconductor device 100 according to the first embodiment of the invention increases.

The resistance value necessary in order to restrict overvoltage (surge protection) is in the region of several tens of Ohms to 200 Ohms, and as this is disposed on the drain region 105 of the starting element 65a, the resistance does not greatly disturb the potential distribution of the starting element 65a when a high voltage is applied.

As heretofore described, the semiconductor device 100 according to the first embodiment of the invention can incorporate the resistor element 121b, which restricts overvoltage. As a result of this, the control IC 31a in which the semiconductor device 100 according to the first embodiment of the invention is used is such that the quantity of externally attached parts decreases, because of which it is possible to achieve a reduction in part cost and assembly cost, and a reduction in size, of the switching power supply control IC and switching power supply device.

In addition to this, the overvoltage resistance with respect to static electricity of the control IC 31a itself can be increased.

Figure 9:
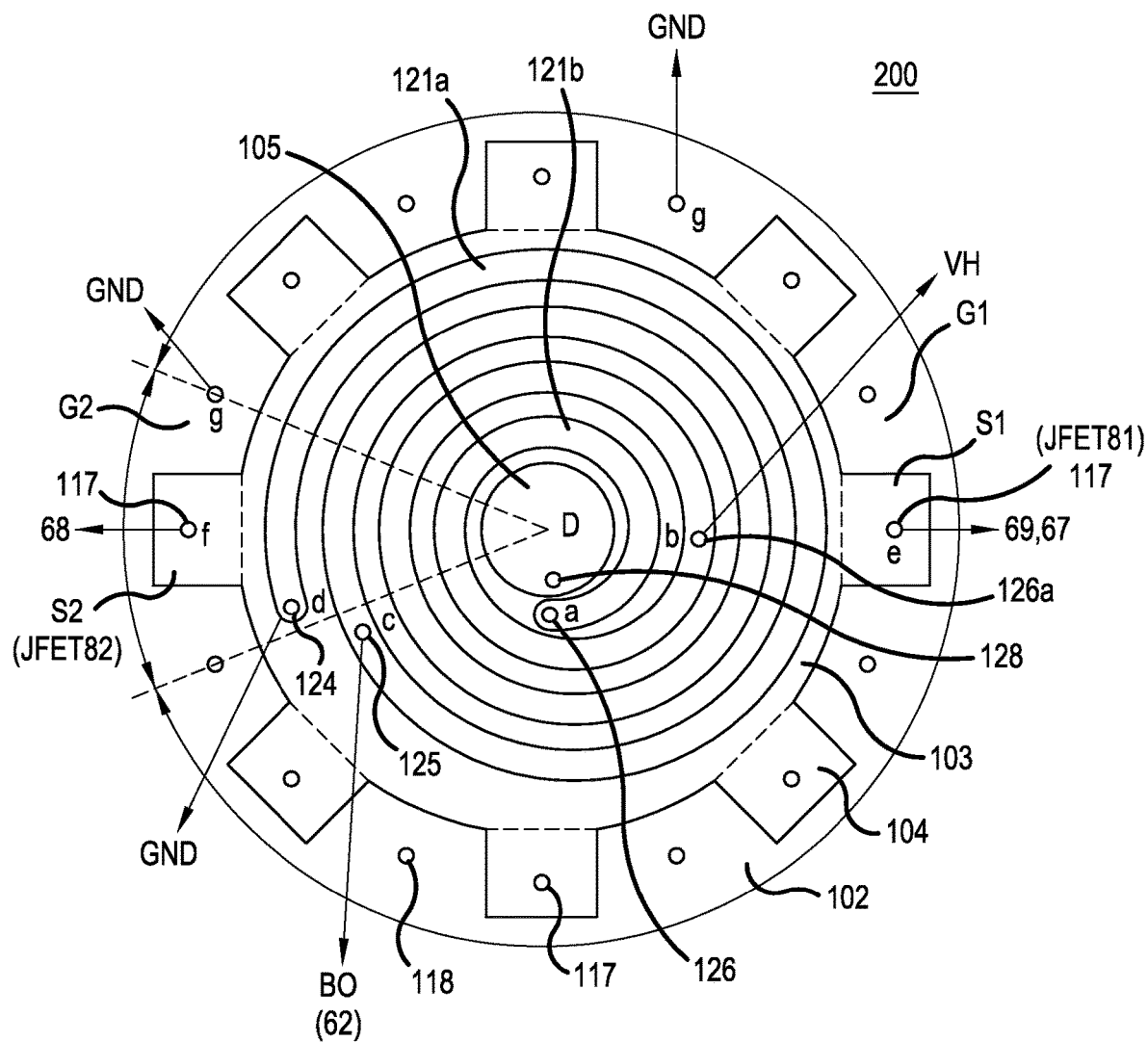
FIG. 9 is a main portion plan view of a semiconductor device according to a second embodiment of the invention.

(Second Embodiment) FIG. 9 is a main portion plan view of a semiconductor device 200 according to the second embodiment of the invention. FIG. 9 shows a high breakdown voltage high resistance element 121a, the resistor element 121b, and the JFETs 81 and 82 configuring the semiconductor device 200 according to the second embodiment of the invention, but an electrode formed in an upper portion is not shown. Also, in FIG. 9, a, b, c, d, e, f, and g indicate the positions of contact holes, while reference signs 126, 126a, 125, 124, 117, and 118 indicate contact holes or contact portions (regions connected by contact holes). a, b, c, d, and g correspond to 126, 126a, 125, 124, and 118 respectively. e and f each correspond to 117, which is in two places. 117 is a contact hole or contact portion connected to the source region 104, wherein the position corresponding to the JFET 81 is e, while the position corresponding to the JFET 82 is f.

The high breakdown voltage high resistance element 121a and the resistor element (first resistor element) 121b are formed integrally, and have a spiral planar form. The high breakdown voltage high resistance element 121a configures a resistive voltage divider circuit, and is configured of a resistor (second resistor element) 73 and a resistor (third resistor element) 74 shown in FIG. 15. When a voltage of 500V is applied to the VH terminal 61, the resistor 73, being connected directly to the VH terminal 61, needs to have a breakdown voltage of 500V, but the resistor 74 is such that a voltage of in the region of 5V is applied. The resistance value of the resistor 73, although not particularly limited, is 1 MΩ or higher, and although there is no particular upper limit of the resistance value, it is equal to or lower than the upper limit of the resistance value that can be provided inside the IC. For example, the upper limit is in the region of 10 MΩ or lower. The resistor element 121b is formed to have a resistance value in the region of several tens of Ohms to 200 Ohms, and is shown as the resistor 91a in FIG. 15.

Figure 15:
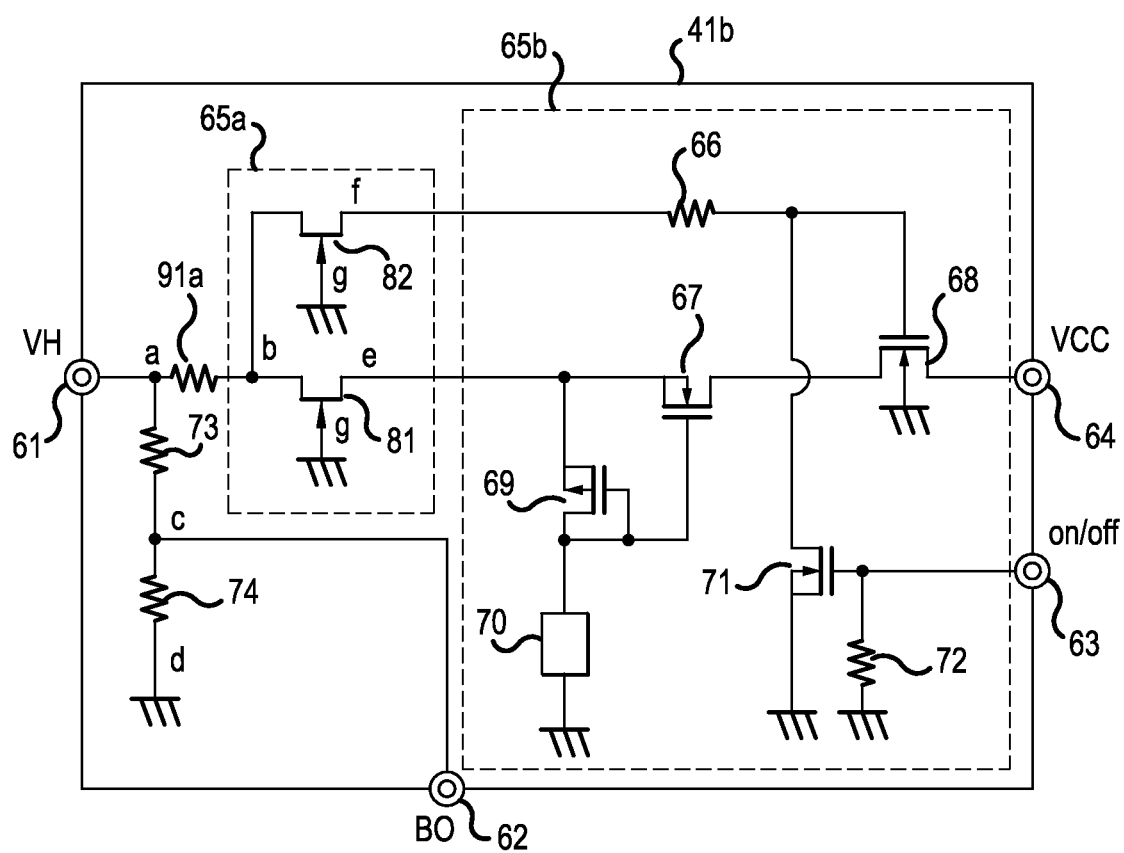
FIG. 15 is a main portion circuit diagram of a starting circuit in which the semiconductor device of FIG. 9 is used.

FIG. 15 is a main portion circuit diagram of the starting circuit 41a in which the semiconductor device 200 according to the second embodiment of the invention is used.

As shown in FIG. 9, the high breakdown voltage high resistance element 121a is mainly formed inside the interlayer dielectric 109 above the second conductivity type (n-type) drift region of the JFET. The JFET is configured of the JFET 81 and JFET 82, and the positions of the contact holes (a to g) connected to the electrode of each portion are also shown in the drawing.

Figure 10:
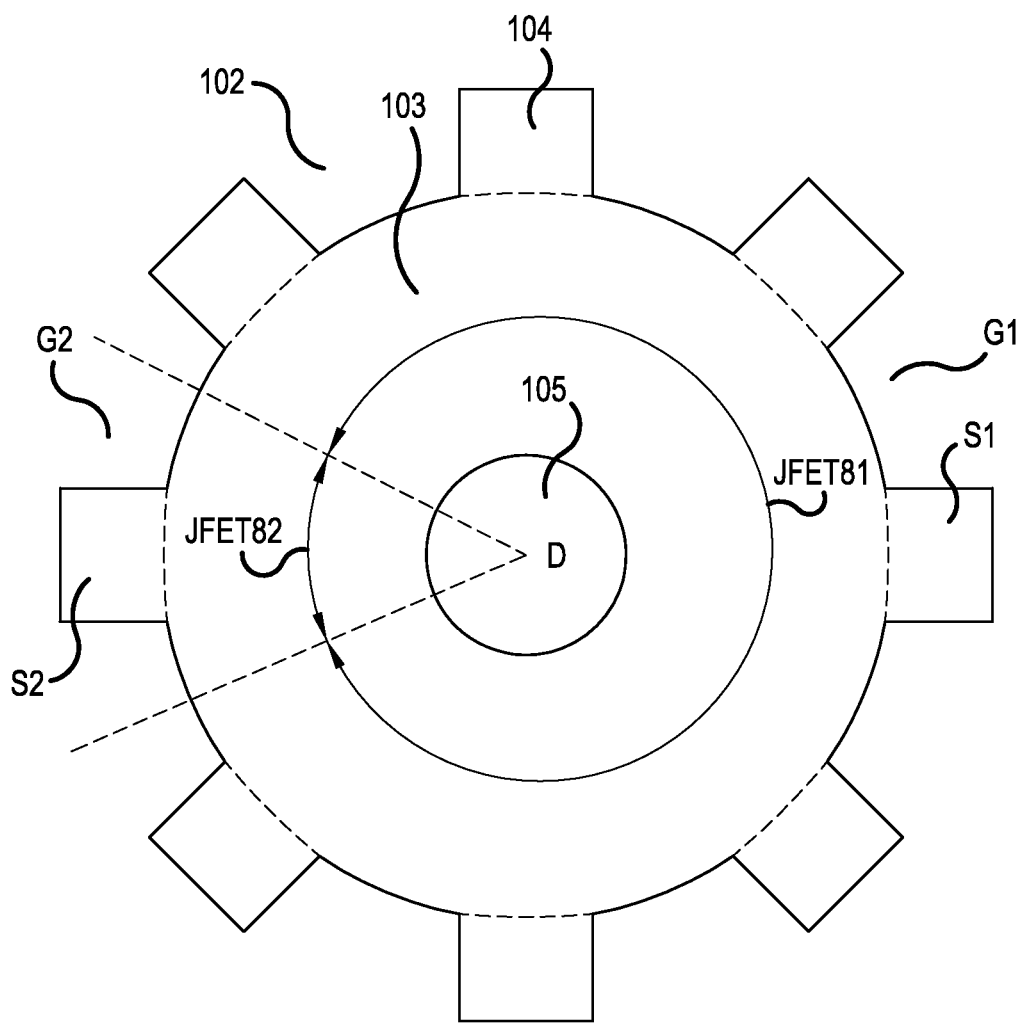
FIG. 10 is a main portion plan view showing a simplification of FIG. 9.

As shown in FIG. 10, the second conductivity type (n-type) source region 104 of the JFET exists in eight places, of which seven are the source region of the JFET 81, and one is the source region of the JFET 82.

Figure 11:
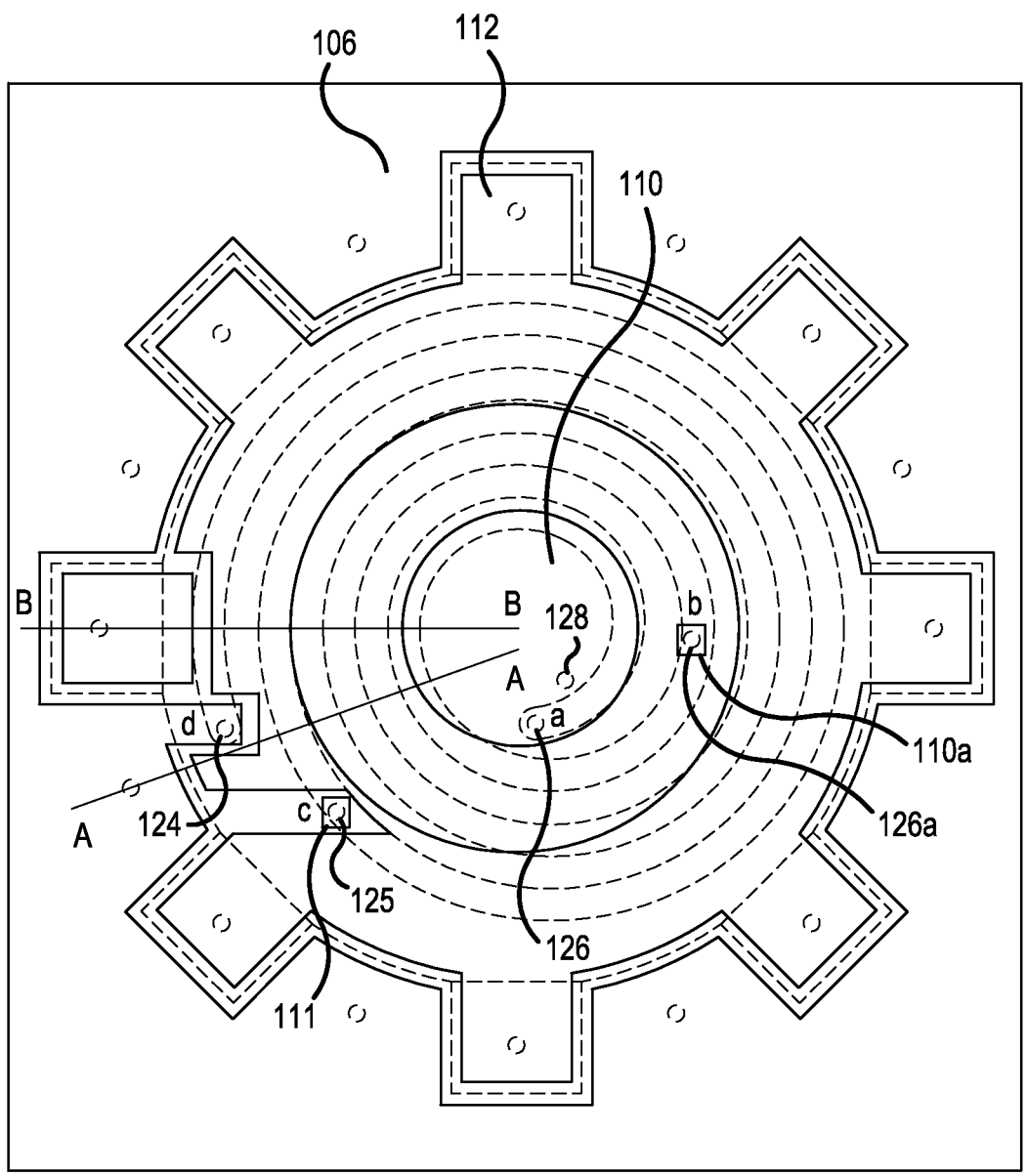
FIG. 11 is a main portion plan view of first layer electrodes of the semiconductor device of FIG. 9.

Of a first layer of metal electrodes, the gate electrode wiring 106 surrounds the first and second source electrode wiring 112 and 113, and the drain electrode wiring 110 is disposed above the drain electrode 105 in a central portion, as shown in FIG. 11. Also, an electrode connected to the high breakdown voltage high resistance element 121a is also disposed. These electrodes are connected to the relevant regions via the contact portions.

Figure 12:
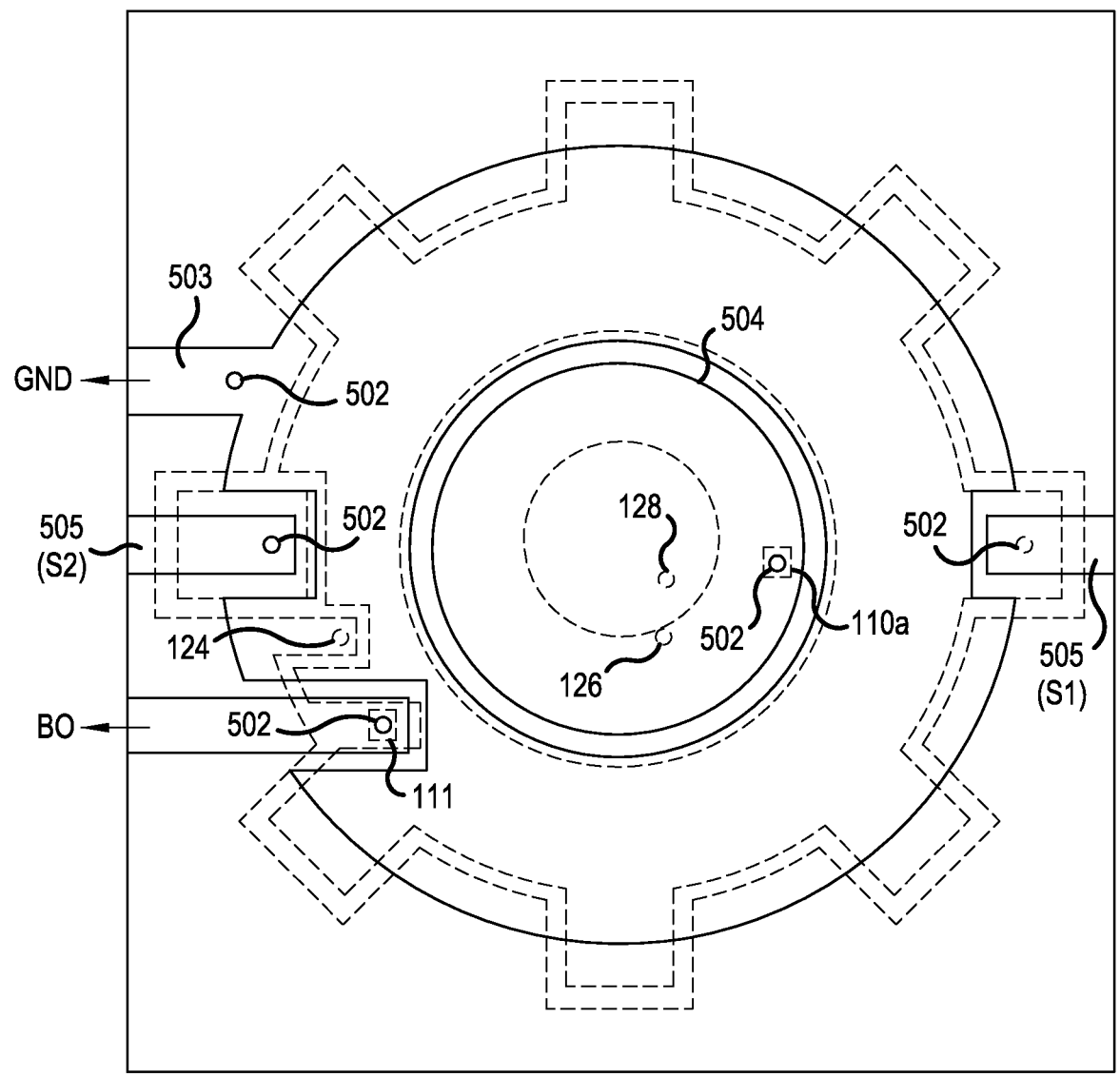
FIG. 12 is a main portion plan view of second layer electrodes of the semiconductor device of FIG. 9.

As shown in FIG. 12, a second layer of metal electrodes is formed across a second layer interlayer dielectric formed above the first layer of metal electrodes, and is connected to the first layer of electrodes via contact portions.

Figure 13A:
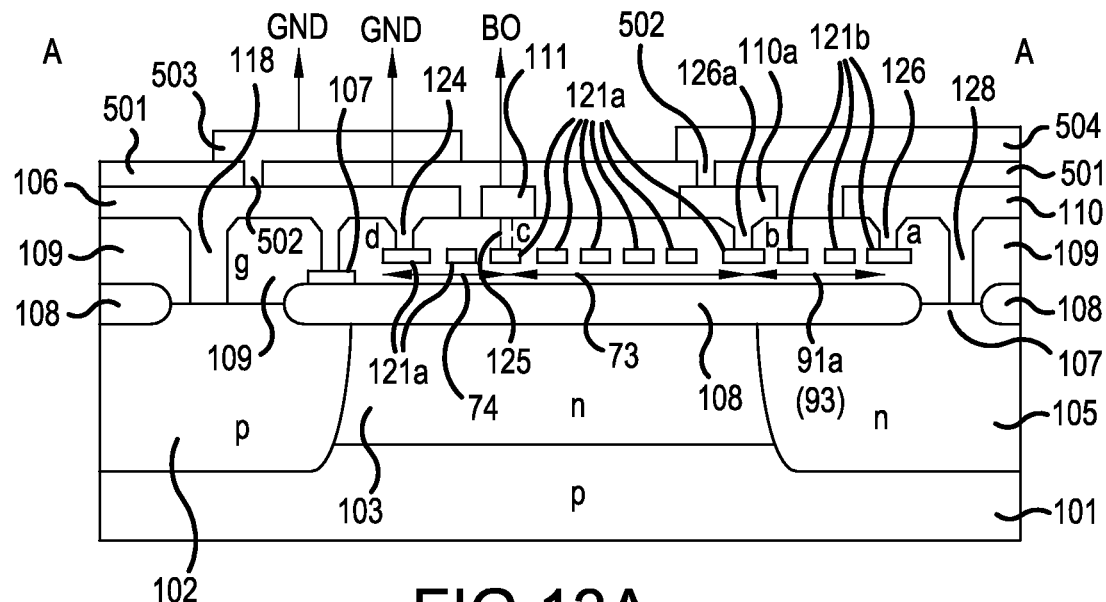
Figure 13B:
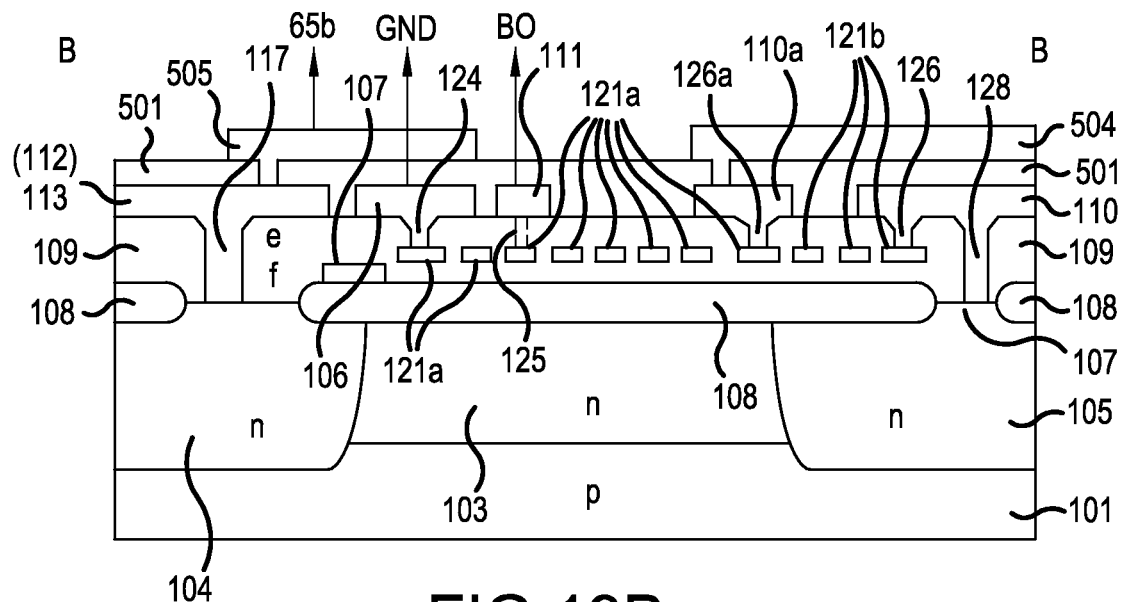

As shown in FIG. 13, each region and the relevant metal electrode are connected via the contact portions. Hatching indicating a cross-section is omitted from FIGS. 13(a) and 13(b) in order to facilitate viewing of the drawings.

As shown in FIG. 15, the VH terminal 61 is connected via the resistor 91a to the JFETs 81 and 82. Also, one end of the resistor 73 configuring the high breakdown voltage high resistance element 121a is connected directly to the VH terminal. The two sources of the JFETs 81 and 82 are connected in the same way as in the starting circuit 41 a shown in FIG.7.

Next, using FIG. 9 to FIG. 13, a description will be given of the JFETs 81 and 82, high breakdown voltage high resistance element 121a, and resistor element 121b of the semiconductor device according to the second embodiment of the invention.

The JFETs 81 and 82 are the same as in the semiconductor device 100 according to the first embodiment. Hereafter, a description will be given of differences between the semiconductor device 200 according to the second embodiment of the invention and the semiconductor device 100 according to the first embodiment of the invention.

The high breakdown voltage high resistance element (second resistor element and third resistor element) 121a and resistor element (first resistor element) 121b, which are spiral form resistors, are embedded inside the interlayer dielectric 109 on the second conductivity type (n-type) drift region 103 and second conductivity type (n-type) drain region 105. The resistor element 121b is formed on the inner side of the spiral, while the high breakdown voltage high resistance element 121a is formed contiguously on the outer side of the spiral. The thickness of the interlayer dielectric 109 between the high breakdown voltage high resistance element 121a and the LOCOS oxide film 108, which has a thickness of in the region of 6,000 Å, is 2,000 Å. The high breakdown voltage high resistance element 121a and resistor element 121b are made of a thin film resistor such as polysilicon or CrSi, and the planar form thereof is formed to be a spiral form.

Also, the gate electrode wiring 106 is formed so as to jut onto the high breakdown voltage high resistance element 121a. Therefore, the intensity of an electrical field generated in a boundary portion of the drift region 103 and first conductivity type (p-type) gate region 102 is relaxed, and breakdown voltage can be further increased in the semiconductor device 200 according to the second embodiment of the invention.

The drain electrode wiring 110 is connected to the pad 504 via the contact portion 126, resistor element 121b, contact portion 126a, relay wiring 110a, and via portion 502.

The termination on the outer side of the high breakdown voltage high resistance element 121a is electrically connected to the gate electrode wiring 106 via the contact portion 124 provided in the interlayer dielectric 109. The high breakdown voltage high resistance element 121a is such that a portion before (inward of) the outer side termination thereof is electrically connected via the contact portion 125 provided in the interlayer dielectric 109 to intermediate tap wiring 111 connected to the BO terminal 62. A portion of the innermost ring of the high breakdown voltage high resistance element 121a is electrically connected via the contact portion 126a provided in the interlayer dielectric 109 to the relay wiring 110a.

Consequently, the resistor element (first resistor element) 121b connected to the VH terminal 61 extends from the contact portion 126 to the contact portion 126a. Also, the high breakdown voltage high resistance element 121a is such that the resistor (second resistor element) 73 extends from the contact portion 126a to the contact portion 125, while the resistor (third resistor element) 74 extends from the contact portion 125 to the contact portion 124.

The semiconductor device 200 according to the second embodiment of the invention is such that the gate region 102a shown in the semiconductor device 100 according to the first embodiment of the invention is not formed, but the gate region 102a can also be formed.

Figure 14A:
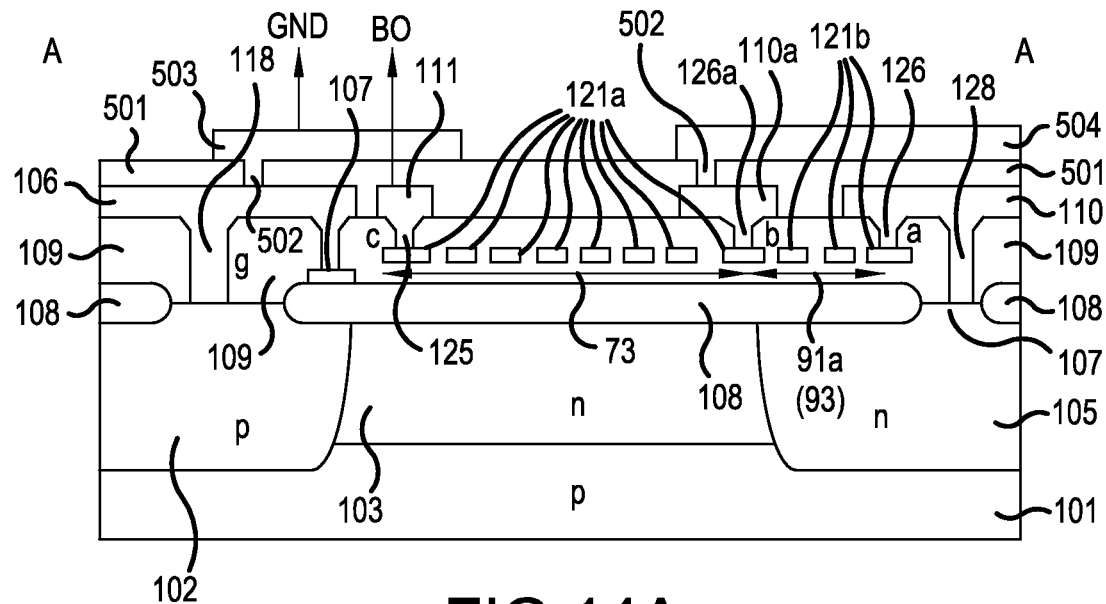
Figure 14B:
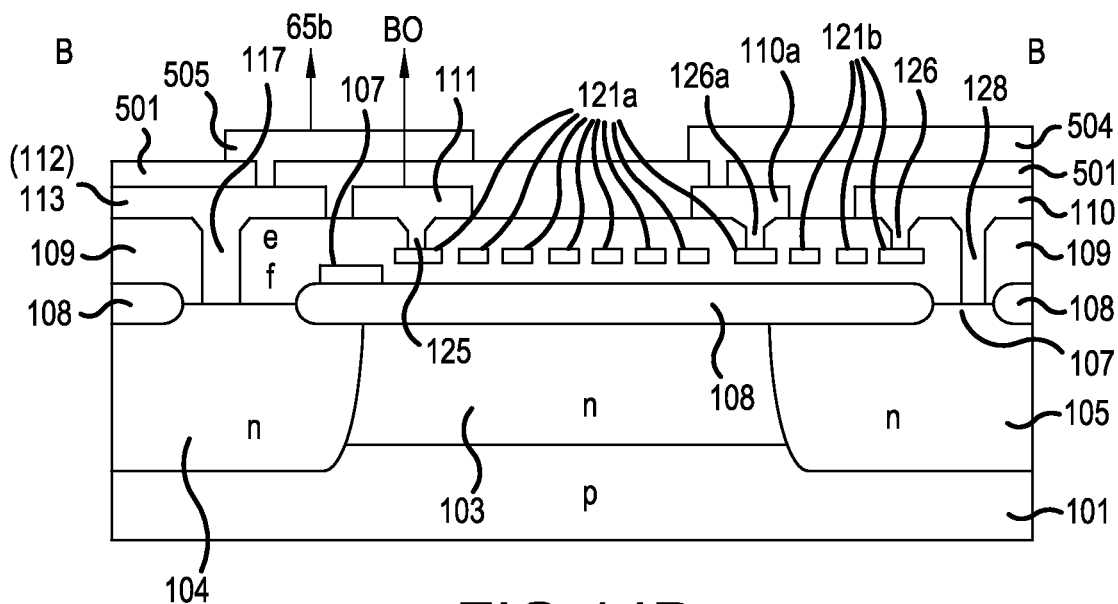

As previously described, the resistor 74 is such that a voltage of in the region of 5V is applied. Therefore, the resistor 74 can be formed after an interlayer dielectric of a thickness of in the region of several hundred angstrom is formed on the semiconductor substrate, and can be formed by a process of forming a general thin film resistor. Therefore, as shown in FIG. 14, the resistor 73 shown in FIG. 15 alone may be provided as the high breakdown voltage high resistance element 121a. In this case, the resistor 74 shown in FIG. 15 can be provided inside a dielectric provided on the semiconductor substrate in a region differing from that of the semiconductor device 200 (a region further to the outer side than the gate region 102) in the same semiconductor substrate, and connected between the intermediate tap wiring 111 and ground. Also, it is also possible to provide a switch between the intermediate tap wiring 111 and resistor 74. This switch is a switch for restricting the current consumed by resistive voltage division, and can be configured by a lateral high breakdown voltage MOSFET or the like.

When attempting to form a high breakdown voltage high resistance element with a breakdown voltage of 500V on a LOCOS oxide film on a semiconductor substrate, without forming the high breakdown voltage high resistance element on the starting element 65a as in the semiconductor device 200, a thickness of 1.7 μm is necessary when assuming the intensity of an electrical field exerted on the LOCOS oxide film to be 3 MV/cm. Time is necessary in order to form this kind of thick LOCOS oxide film.

As the operation of the starting element 65a of FIG. 15 is the same as that in FIG. 7, a description will be omitted.

As heretofore described, the semiconductor device 200 according to the second embodiment of the invention is such that, as the overvoltage restricting resistor 91 a is integrated in the same semiconductor substrate as the JFETs 81 and 82, the same advantages as with the semiconductor device 100 according to the first embodiment of the invention are achieved.

(Third Embodiment) A description will be given, using FIG. 16, of a semiconductor device 300 according to the third embodiment of the invention. A JFET 610 of another configuration can be used instead of the previously described JFETs 81 and 82. The JFETs 610 and 611 are such that a depletion layer extending from a gate region 705 and p-type substrate 701 extends in a vertical direction, causing pinch-off.

Figure 16A:
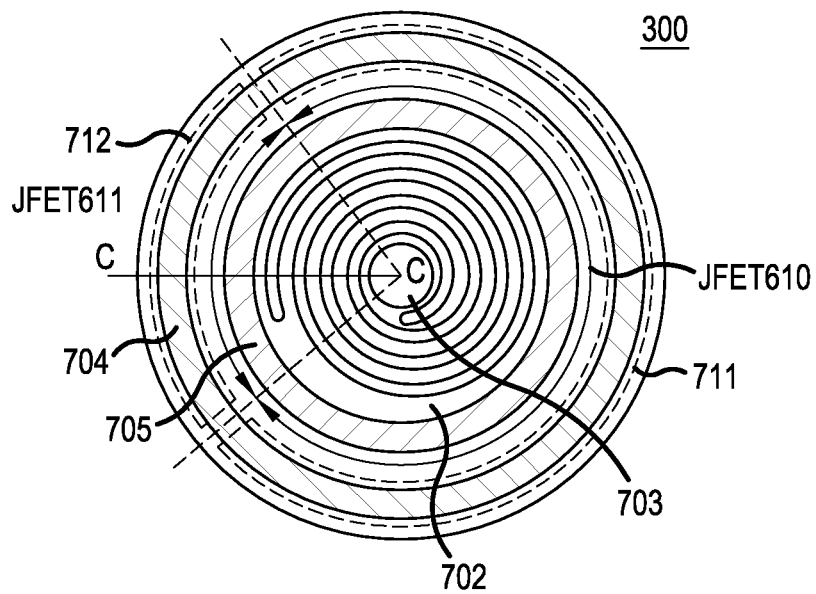
Figure 16B:
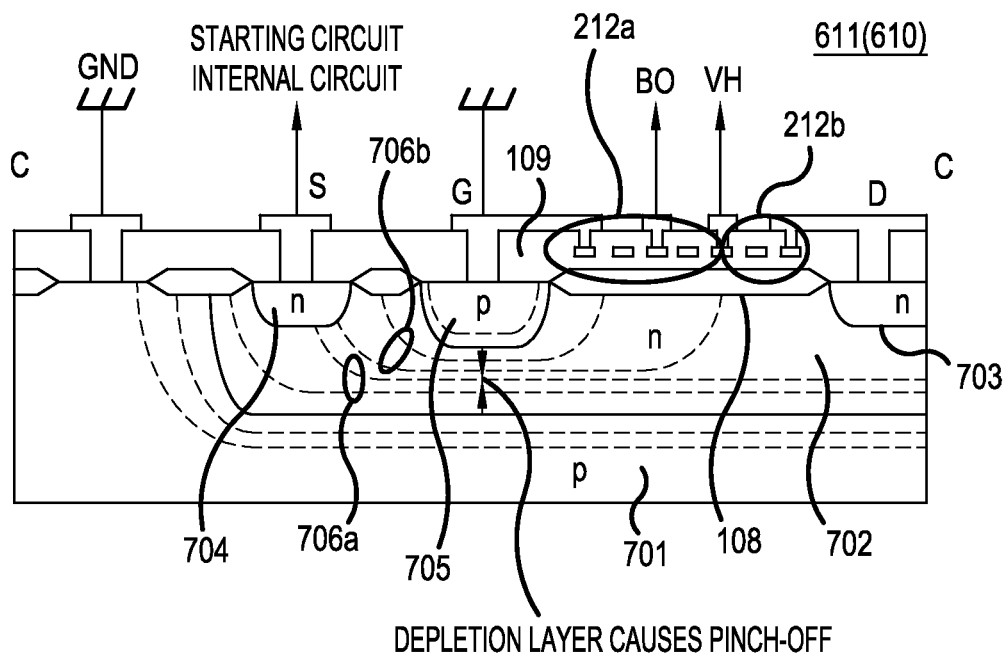

With regard to electrodes in FIG. 16(a), source electrodes alone are indicated by dotted lines for the sake of convenience. In FIG. 16(b), two source electrodes, those being first source electrode wiring 711 and second source electrode wiring 712, are formed, wherein the first source electrode wiring 711 side is the JFET 610 and corresponds to the JFET 81 of FIG. 9, while the second source electrode wiring 712 side is the JFET 611 and corresponds to the JFET 82 of FIG. 9. The JFETs 610 and 611 include an n-type well region that forms a second conductivity type (n-type) drift region 702 disposed in a surface layer of the p-type substrate 701, an n-type region that forms a second conductivity type (n-type) drain region 703 disposed in a surface layer of the n-type well region, an n-type region that forms a second conductivity type (n-type) source region 704 disposed distanced from the drift region 702 on the periphery of the drain region 703, and a p-type region that forms the first conductivity type (p-type) gate region 705 disposed between the drain region 703 and source region 704. Also, the gate region 705 is disposed distanced from the drain region 703. Also, the LOCOS oxide film 108 is disposed on the drift region 702, and a high breakdown voltage high resistance element 212a and a resistor element 212b are disposed inside the interlayer dielectric 109 on the LOCOS oxide film 108. Although the drain region 703 and source region 704 are formed distanced from the p-n junction of the p-type substrate 701 and drift region 702, they may also be formed so as to be in contact. Also, although the source region 704 is formed in one region of a circular planar form, the source region 704 may also be formed divided into a plurality of regions in a circumferential direction.

The JFETs 610 and 611 are of a configuration wherein a depletion layer 706a extending from the p-type substrate 701 to the drift region 702 and a depletion layer 706b extending from the gate region 705 in the direction of the substrate 701 in the drift region 702 are caused to pinch off (joined), thereby controlling the current. In this case too, the circuit configuration is the same as in Example 2. Reference sign S in the drawing indicates a source, G a gate, and D a drain.

With this kind of configuration too, as the semiconductor device 300 according to the third embodiment of the invention can include the resistor element 212b, the semiconductor device 300 according to the third embodiment of the invention can achieve the same advantages as the semiconductor device 200 according to the second embodiment of the invention.

Figure 17:
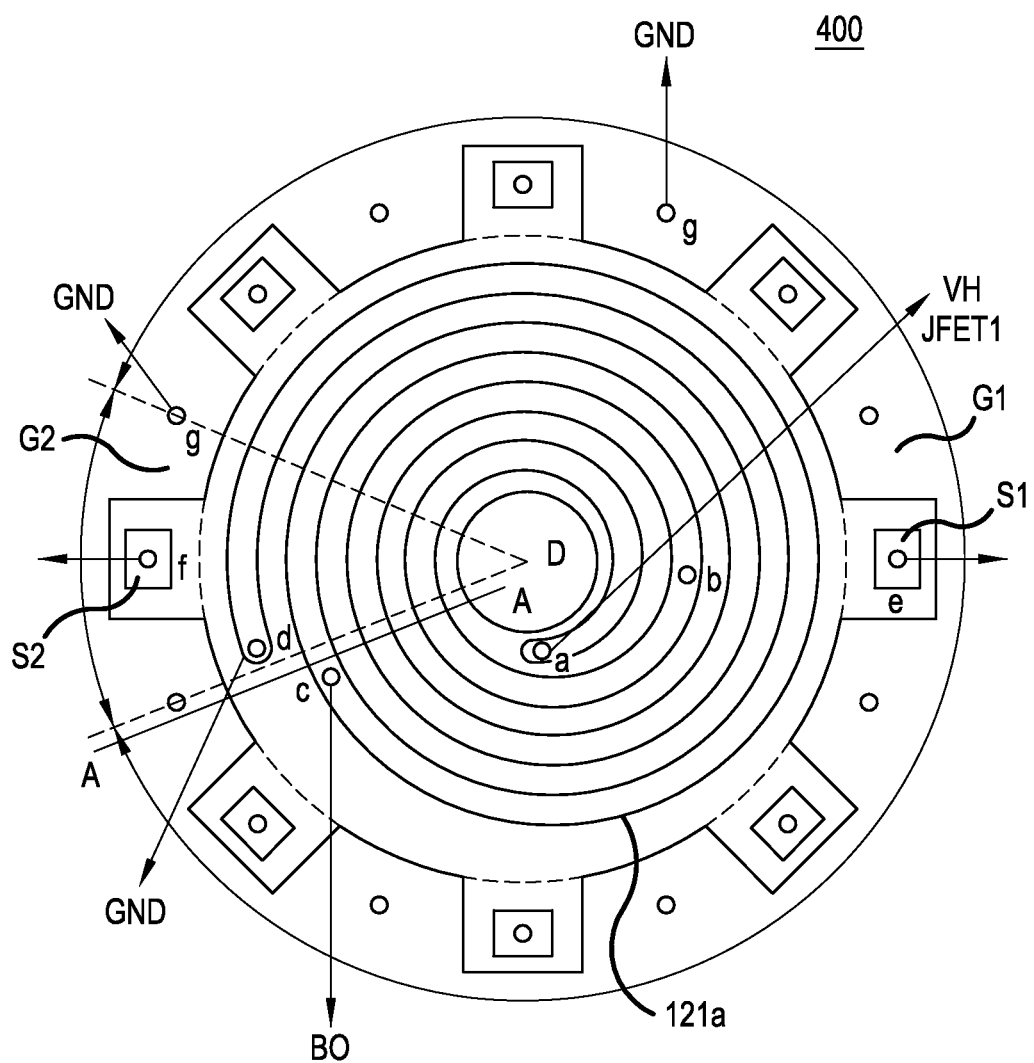
FIG. 17 is main portion plan view of a semiconductor device according to a fourth embodiment of the invention.
Figure 18:
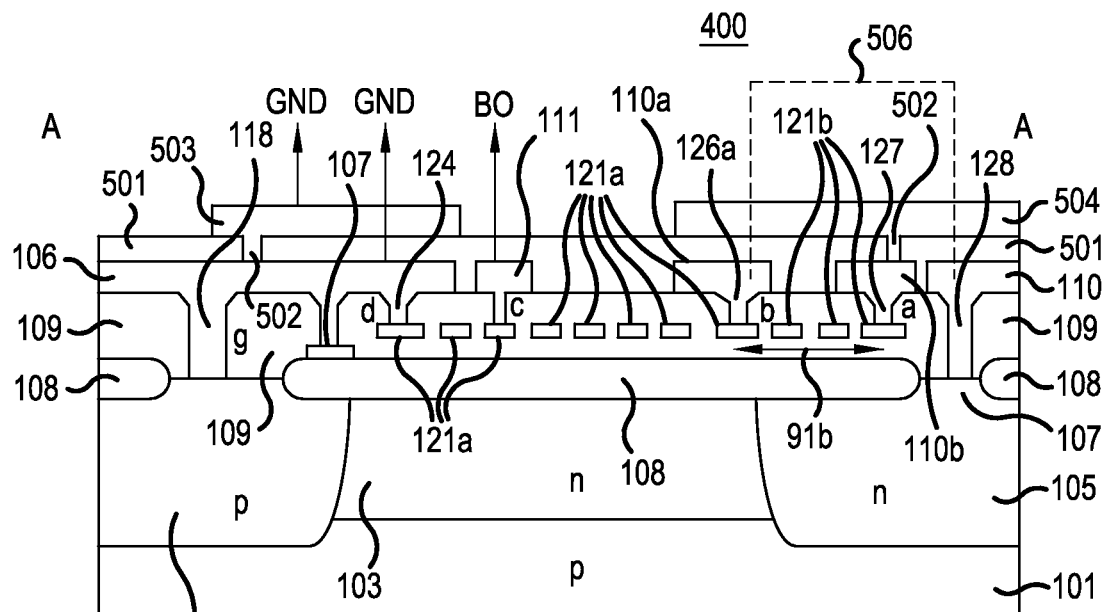
FIG. 18 is a main portion sectional view showing a sectional structure along an A-A line of FIG. 17.
Figure 19:
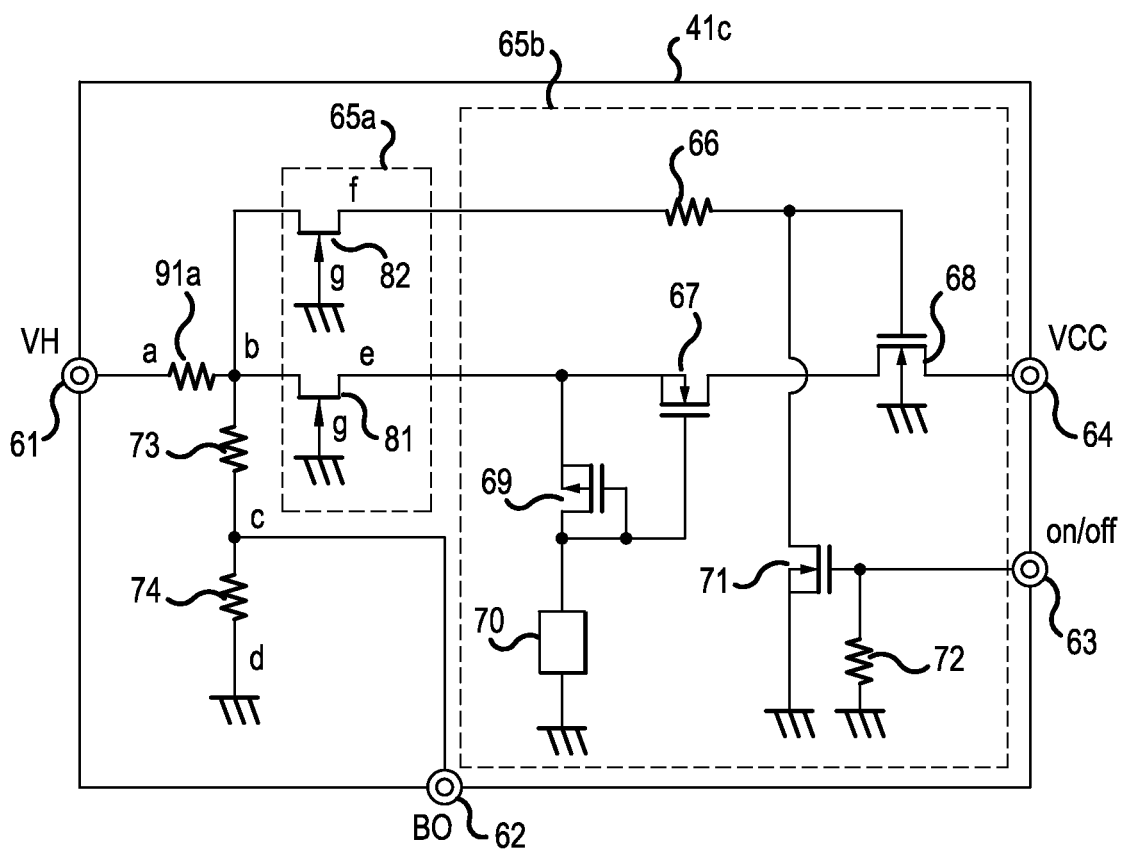
FIG. 19 is a main portion circuit diagram of a starting circuit in which the semiconductor device of FIG. 16 is used.

(Fourth Embodiment) A description will be given, using FIG. 17 to FIG. 19, of a semiconductor device 400 according to the fourth embodiment of the invention.

The differences between the semiconductor device 400 according to the fourth embodiment of the invention and the semiconductor device 200 according to the second embodiment of the invention are that the drain electrode wiring 110 of FIG. 12 is divided into the drain electrode wiring 110 connected via the contact portion 128 to the second conductivity type (n-type) drain region 105 and wiring 110b connected via a contact portion 127 to an inner side end portion of the resistor element 121b, and that the relay wiring 110a and drain electrode wiring 110 are connected by wiring 506 indicated by a dotted line. The wiring 506 is a second layer wiring layer, and is formed simultaneously with the pad 504.

Although not formed in the semiconductor device 400 according to the fourth embodiment of the invention, the gate region 102a shown in the semiconductor device 100 according to the first embodiment of the invention can also be formed.

The overvoltage restricting resistor 121b is inserted by this connection between the resistors 73 and 74 configuring the resistive voltage dividing circuit and the VH terminal 61. Therefore, the semiconductor device 400 according to the fourth embodiment of the invention is such that not only the JFETs 81 and 82, but also the BO comparator 44 connected to the resistors 73 and 74 can be protected from overvoltage.

Figure 20A:
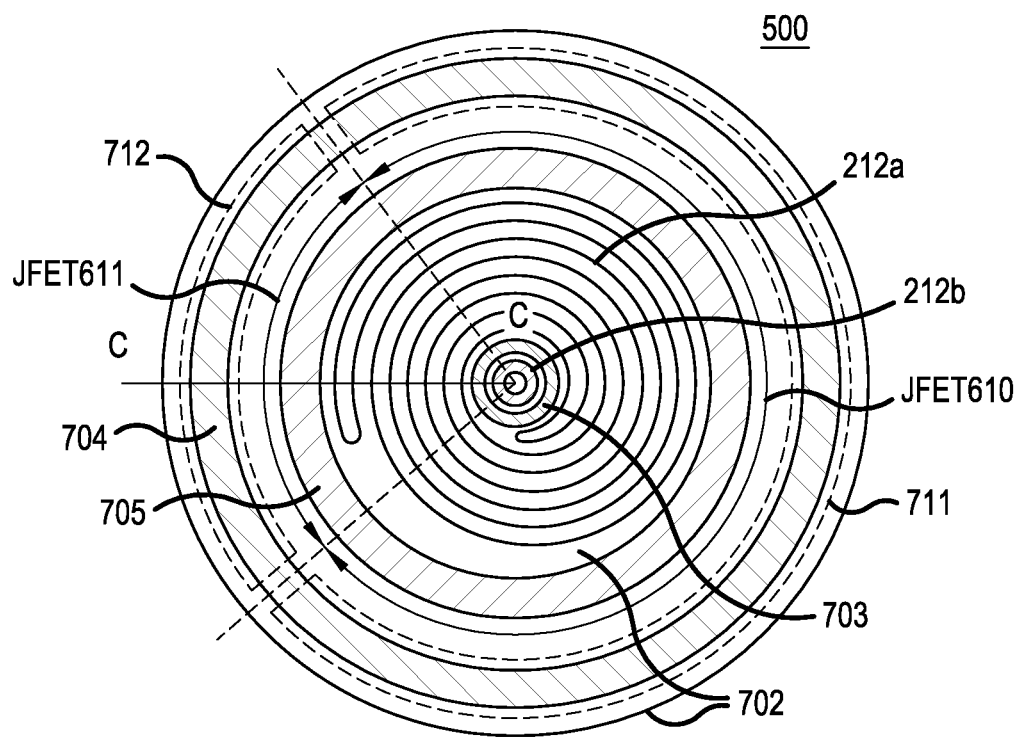
Figure 20B:
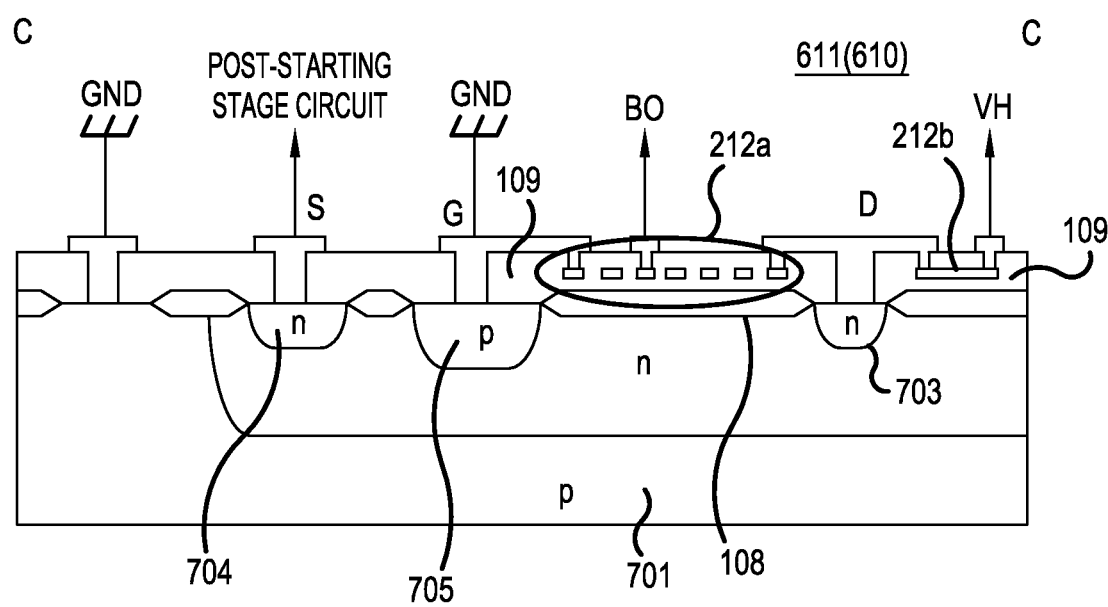

(Fifth Embodiment) A description will be given, using FIG. 20, of a semiconductor device 500 according to the fifth embodiment of the invention.

The difference between the semiconductor device 500 according to the fifth embodiment of the invention and the semiconductor device 300 according to the third embodiment of the invention is that the high breakdown voltage high resistance element 212a and the resistor element 212b are formed separately. The resistor element 212b is formed inside the interlayer dielectric 109 in a region surrounded by the second conductivity type (n-type) drain region 703. Therefore, the starting circuit is such that, in the same way as a starting circuit 41b shown in FIG. 19, the VH terminal 61 and one end of the resistor element 212b are connected, while the other end of the resistor element 212b is connected to the drain region of the JFETs 610 and 611 and the high potential side of the high breakdown voltage high resistance element 212a. Although the planar form of the high breakdown voltage high resistance element 212a is a spiral form, in the same way as in FIG. 16, the planar form of the resistor element 212b is formed to be circular. This is the same as in FIG. 2(a).

With this kind of configuration too, the semiconductor device 500 according to the fifth embodiment of the invention can achieve the same advantages as the semiconductor device 400 according to the fourth embodiment of the invention.

The planar form of the resistor element 212b may also be a spiral form or plate form, as in FIG. 2. The planar form of the drain region 703 is a circular form but, this not being limiting, the drain region 703 may be formed in the same way as in the semiconductor device according to the first embodiment of the invention. In this case, the resistor element 212b is formed inside the interlayer dielectric 109 on the inner side of the contact 128.

Also, the resistor element 121b can be formed inside the interlayer dielectric 109 on the inner side of the contact 128 in Example 1 too.

(Sixth Embodiment) A description will be given, using FIG. 22, of a switching power supply device according to the sixth embodiment of the invention.

Figure 22:
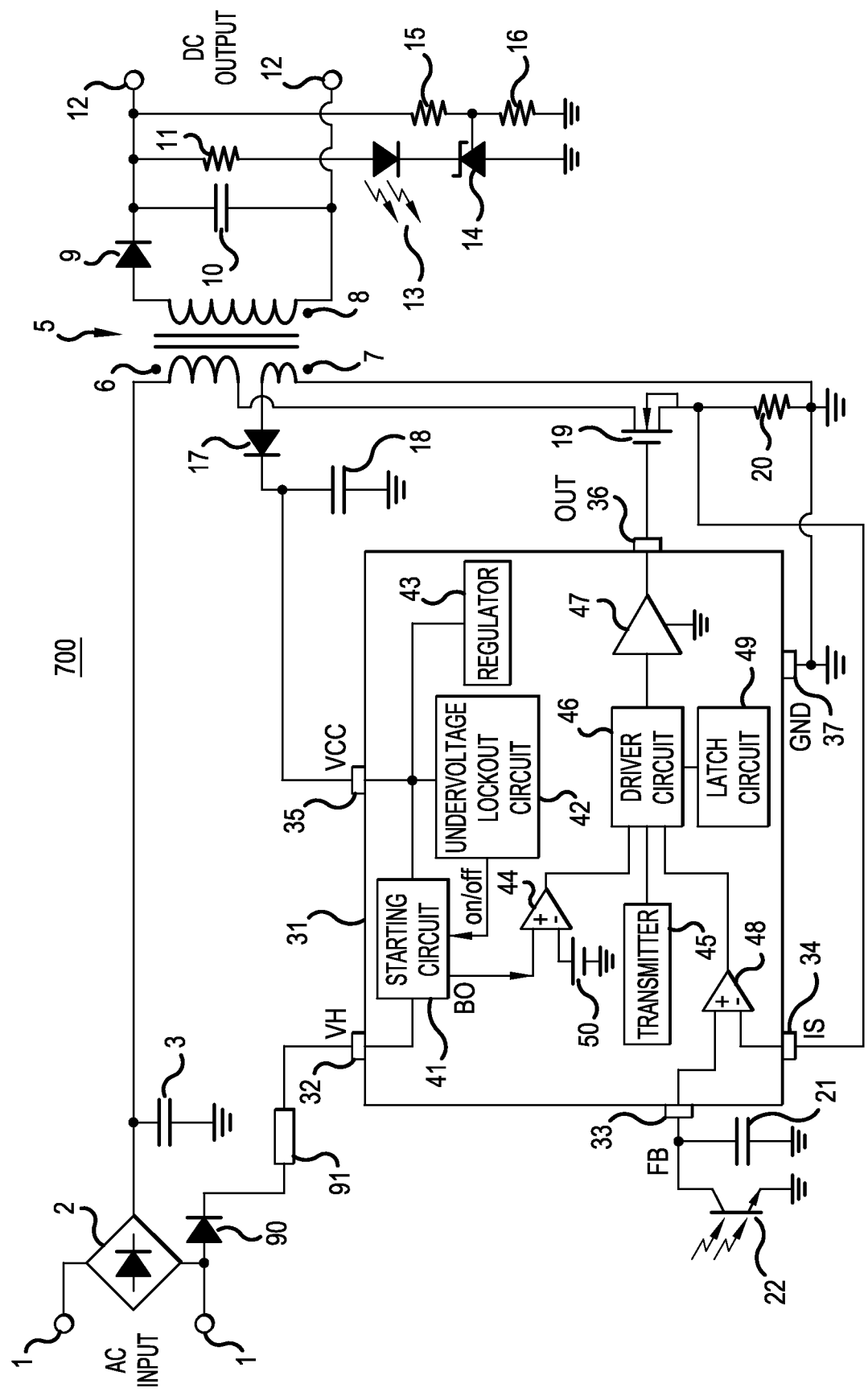
FIG. 22 is a circuit diagram showing the configuration of an existing switching power supply device.
Figure 23:
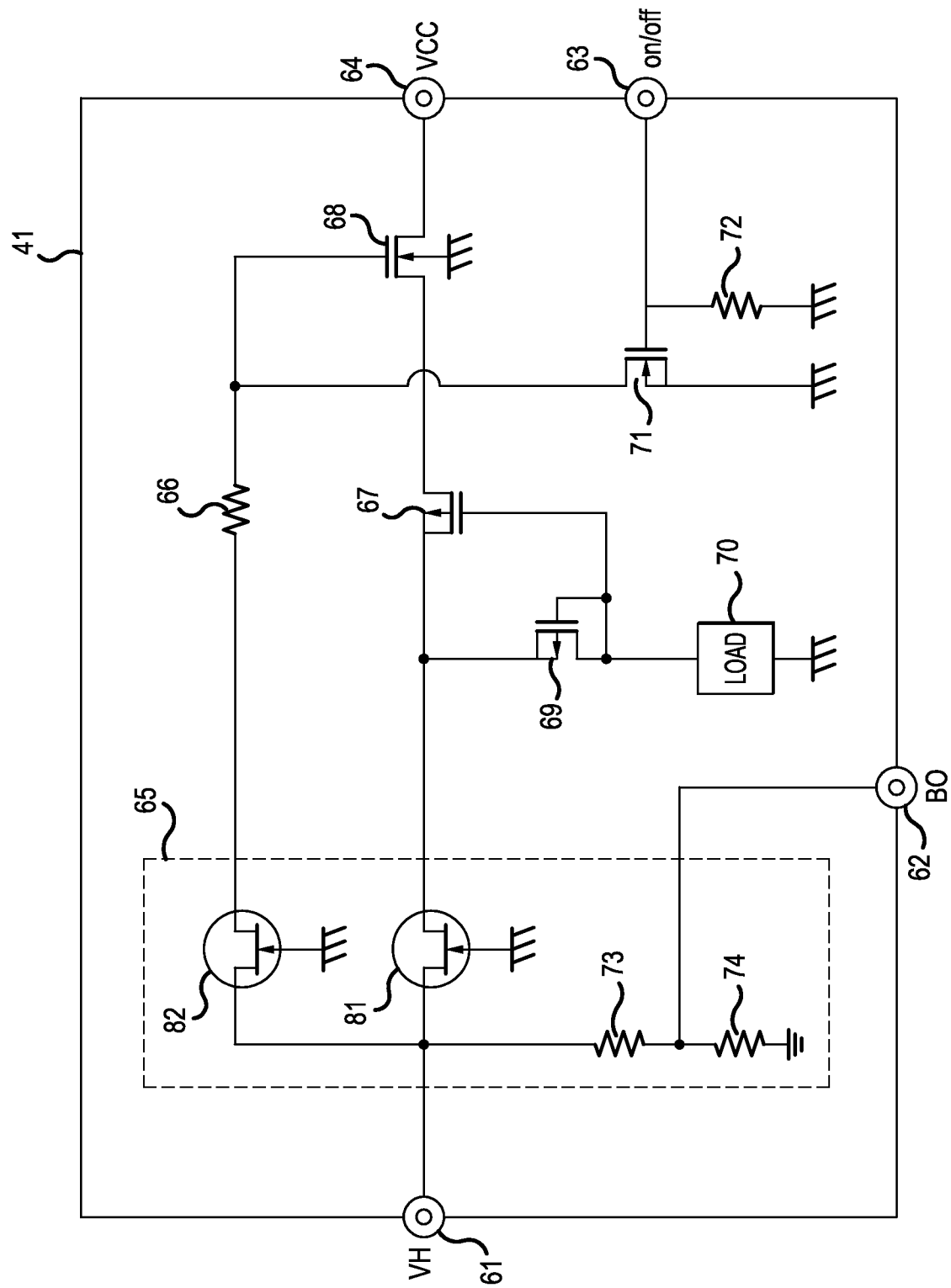
FIG. 23 is a circuit diagram showing the configuration of a starting circuit mounted in the switching power supply device of FIG. 22.
Figure 24:
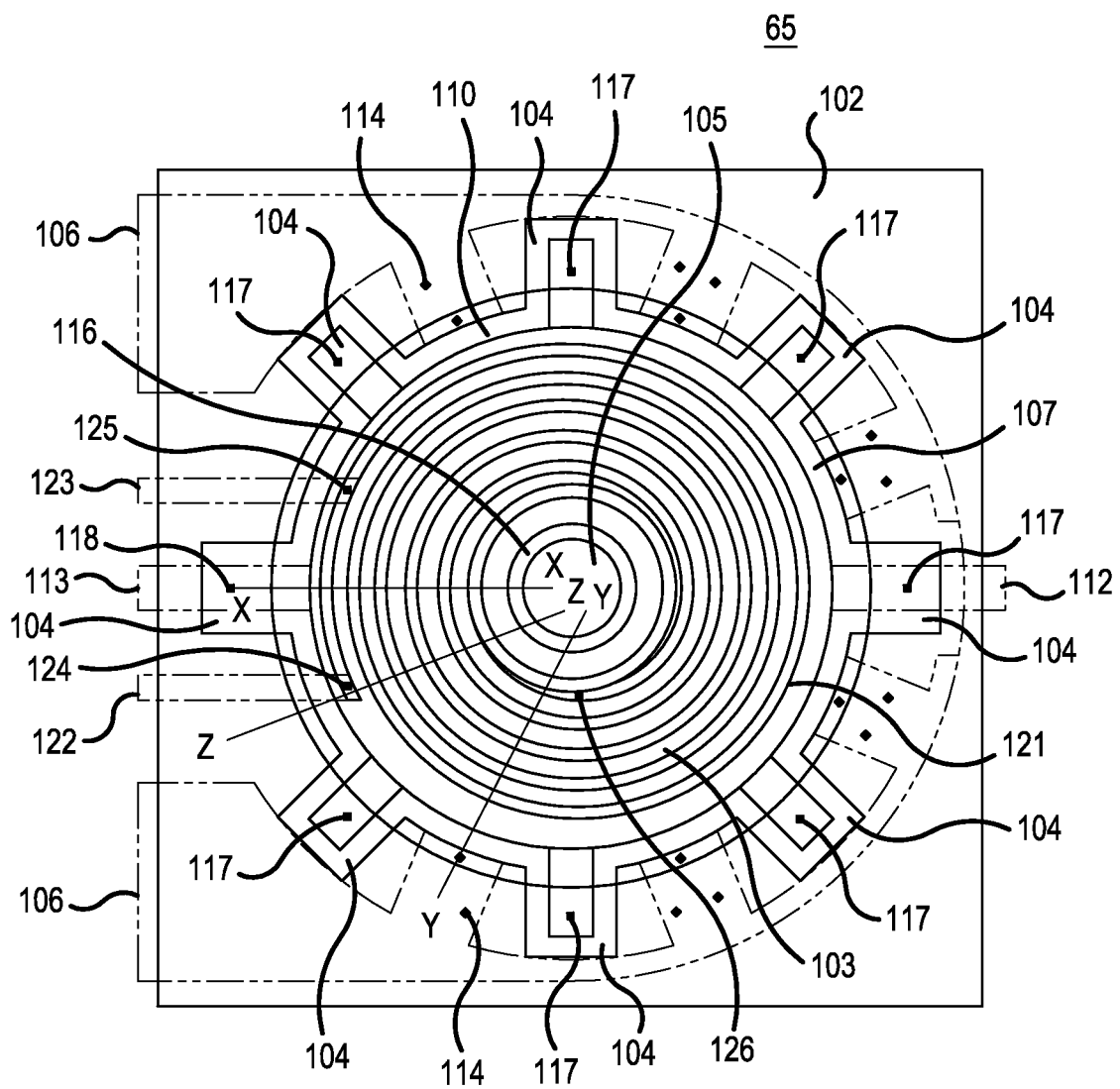
FIG. 24 is a main portion plan view of a JFET configuring a starting circuit 41 of FIG. 23.
Figure 25A:
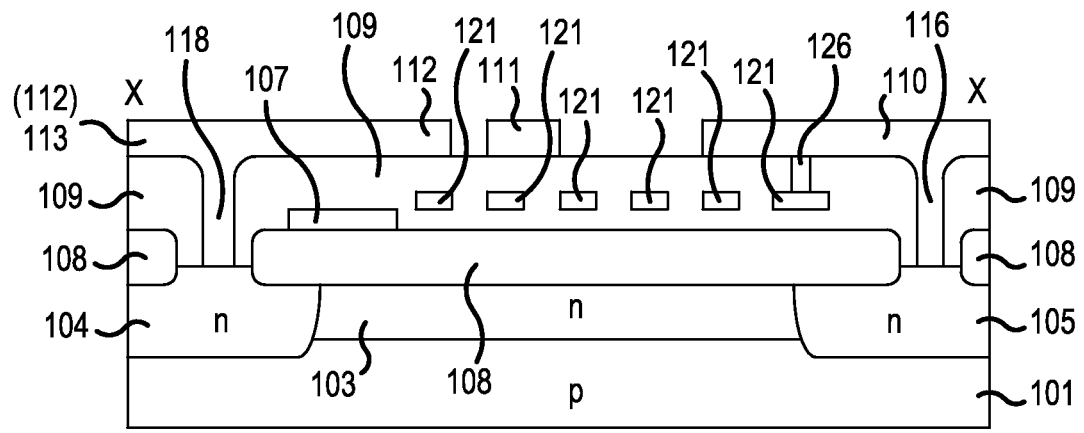
Figure 25B:
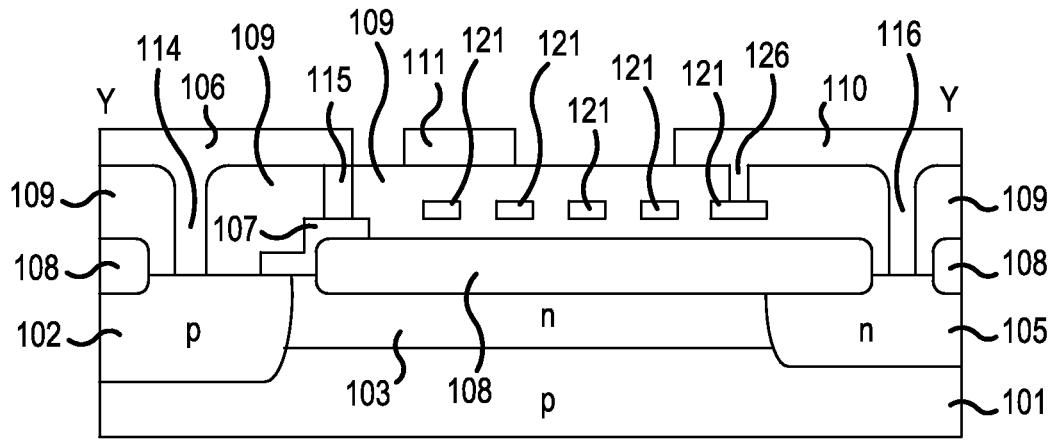
Figure 25C:
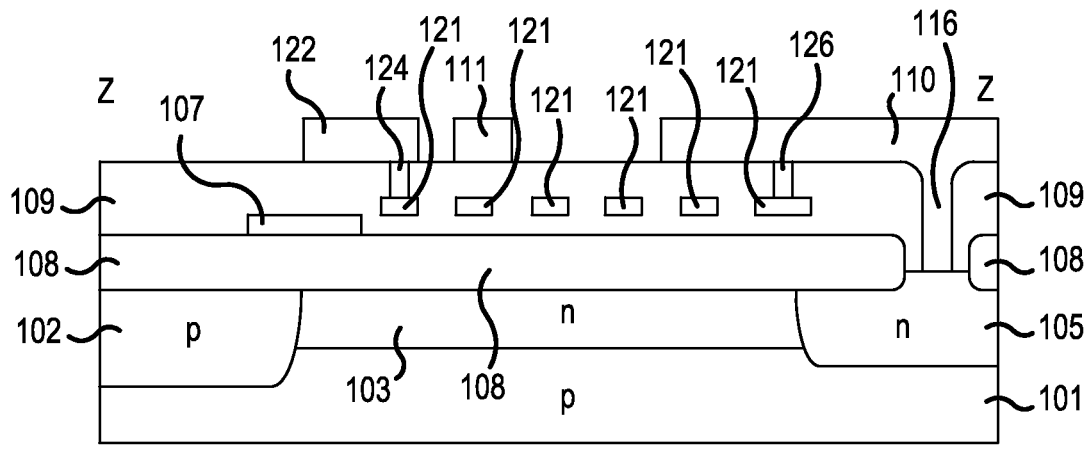

The difference between a switching power supply device 600 according to the sixth embodiment of the invention and the switching power supply device 700 of FIG. 22 is that the overvoltage restricting resistor 91 of FIG. 22 is incorporated as 91 a inside starting circuits 41a, 41b, and 41c.

By adopting the starting circuits 41a, 41b, and 41c including a resistor 91b, the switching power supply device 600 according to the sixth embodiment of the invention is such that a reduction in assembly time and a reduction in size can be achieved. Also, in the case of the switching power supply device 600 including the starting circuit 41b, the BO comparator 44 can be protected from overvoltage.

The control IC 31a has the VH terminal (high breakdown voltage input terminal) 32, into which voltage of in the region of, for example 500V is input, a feedback input terminal (hereafter referred to as an FB terminal) 33, into which is input a signal based on the output voltage of the switching power supply device 700, a current sense input terminal (hereafter referred to as an IS terminal) 34, the power supply voltage terminal (hereafter referred to as the VCC terminal) 35 of the control IC 31a, a gate drive terminal (hereafter referred to as an OUT terminal) 36 of a MOSFET 19, and a ground terminal (hereafter referred to as a GND terminal) 37. The GND terminal 37 is grounded.

AC input is supplied via an AC input terminal 1 to a rectifier 2. The rectifier 2 carries out full-wave rectification of the AC input. A power supply capacitor 3 is connected in parallel with an output terminal of the rectifier 2, and is charged by direct current voltage output from the rectifier 2. The charged power supply capacitor 3 forms a direct current power supply that supplies direct current voltage to a primary coil 6 of a transformer 5.

The primary coil 6 is connected between the power supply capacitor 3 and the drain terminal of the MOSFET 19, which functions as a switching element. The source terminal of the MOSFET 19 is connected to the IS terminal 34 of the control IC 31 and one end of a resistor 20. The other end of the resistor 20 is grounded. Current flowing through the MOSFET 19 is converted into voltage by the resistor 20, and the voltage is applied to the IS terminal 34. The gate terminal of the MOSFET 19 is connected to the OUT terminal 36 of the control IC 31a.

One end of the auxiliary coil 7 of the transformer 5 is connected to the anode terminal of the rectifying diode 17. The other end of the auxiliary coil 7 is grounded. Current induced by a switching operation of the MOSFET 19 flows through the auxiliary coil 7. The rectifying diode 17 rectifies the current flowing through the auxiliary coil 7, thereby charging the capacitor 18 connected to the cathode terminal of the rectifying diode 17. The capacitor 18 is connected to the VCC terminal 35 of the control IC 31a, and forms a direct current power supply for causing a switching operation of the MOSFET 19 to continue.

Voltage based on the voltage of the power supply capacitor 3 is induced by a switching operation of the MOSFET 19 in a secondary coil 8 of the transformer 5. One end of the secondary coil 8 is connected to the anode terminal of a rectifying diode 9. The cathode terminal of the rectifying diode 9 and the other end of the secondary coil 8 are connected to a DC output terminal 12. Also, a smoothing capacitor 10 is connected between the cathode terminal of the rectifying diode 9 and the other end of the secondary coil 8. The rectifying diode 9 rectifies current flowing through the secondary coil 8, thereby charging the smoothing capacitor 10. The charged smoothing capacitor 10 supplies a direct current output (DC output) controlled so as to reach the desired direct current voltage value to an unshown load connected to the DC output terminal 12.

Also, a series resistor circuit formed of two resistors 15 and 16, and one end of a resistor 11, are connected to the cathode terminal of the rectifying diode 9 and a connection node of the DC output terminal 12. The other end of the resistor 11 is connected to the anode terminal of a photodiode 13 configuring a photocoupler. The cathode terminal of the photodiode 13 is connected to the cathode terminal of a shunt regulator 14. The anode terminal of the shunt regulator 14 is grounded. The resistors 11, 15, and 16, the photodiode 13, and the shunt regulator 14 configure a voltage detection and feedback circuit that detects direct current output voltage at either end of the smoothing capacitor 10, and adjusts the direct current output voltage.

An optical signal is output from the photodiode 13 so as to adjust the direct current output voltage at either end of the smoothing capacitor 10 to the desired direct current voltage value based on the setting value in the shunt regulator 14. The optical signal is received by a phototransistor 22 that configures the photocoupler together with the photodiode 13, forming a feedback signal to the control IC 31a. As the phototransistor 22 is connected to the FB terminal 33 of the control IC 31a, the feedback signal is input into the FB terminal 33. Also, a capacitor 21 is connected to the phototransistor 22. The capacitor 21 forms a noise filter for the feedback signal.

The control IC 31a includes the starting circuit 41a, starting circuit 41b, or starting circuit 41c, an undervoltage lockout circuit (UVLO) 42, a regulator 43, the BO comparator 44, an oscillator 45, a driver circuit 46, an output amplifier 47, a pulse width modulation comparator (hereafter referred to as a PWM comparator) 48, a latch circuit 49, and a reference power supply 50.

The starting circuits 41a, 41b, and 41c are connected to the VH terminal 32, the VCC terminal 35, and the non-inversion input terminal of the BO comparator 44. The starting circuits 41a, 41b, and 41c supply current to the VCC terminal 35 when the power supply is started up.

The undervoltage lockout circuit 42 is connected to the VCC terminal 35 and starting circuits 41a, 41b, and 41c. When the voltage of the VCC terminal 35 rises to the voltage necessary for an operation of the control IC 31a owing to the current supplied from the starting circuits 41a, 41b, and 41c, the undervoltage lockout circuit 42 stops the supply of current from the starting circuits 41a, 41b, and 41c to the VCC terminal 35. Subsequent supply of current to the VCC terminal 35 is carried out from the auxiliary coil 7. The regulator 43 is connected to the VCC terminal 35, and generates a reference voltage necessary for the operation of each portion of the control IC 31 based on the voltage of the VCC terminal 35. After the power supply is started up, the control IC 31 is driven by the reference voltage output from the regulator 43.

The inversion input terminal and non-inversion input terminal of the PWM comparator 48 are connected to the IS terminal 34 and FB terminal 33 respectively. The PWM comparator 48 inverts the output thereof in accordance with the relationship between the sizes of the inversion input terminal voltage and non-inversion input terminal voltage. The output of the PWM comparator 48 is input into the driver circuit 46.

As the oscillator 45 is connected to the driver circuit 46, an oscillation signal from the oscillator 45 is input into the driver circuit 46. When a turn-on signal is input from the oscillator 45 into the driver circuit 46, and the non-inversion input terminal voltage of the PWM comparator 48 (that is, the voltage of the FB terminal 33) is greater than the inversion input terminal voltage (that is, the voltage of the IS terminal 34), the output signal of the driver circuit 46 switches to a High state. The output amplifier 47 amplifies the High state signal output from the driver circuit 46, thereby driving the gate of the MOSFET 19 via the OUT terminal 36.

Meanwhile, when the inversion input terminal voltage of the PWM comparator 48 becomes greater than the non-inversion input terminal voltage, the PWM comparator 48 inverts, and the output signal of the driver circuit 46 switches to a Low state. The output amplifier 47 amplifies the Low state signal output from the driver circuit 46, and supplies the signal to the gate of the MOSFET 19 via the OUT terminal 36. Consequently, the MOSFET 19 switches to an off-state, and current ceases to flow to the MOSFET 19. In this way, by variably controlling the on-state period of the MOSFET 19 by changing the threshold level of the PWM comparator 48 in accordance with the secondary side output voltage, the secondary side output voltage stabilizes.

Also, the inversion input terminal of the BO comparator 44 is connected to the reference power supply 50. The BO comparator 44 inverts the output thereof in accordance with the relationship between the sizes of the non-inversion input terminal voltage and inversion input terminal voltage. As will be described hereafter, a signal of a low voltage resistively divided by a resistor inside the starting circuits 41a, 41b, and 41c is input into the BO comparator 44, because of which the BO comparator 44 can be configured of a low breakdown voltage MOS. The output of the BO comparator 44 is input into the driver circuit 46.

When the non-inversion input terminal voltage of the BO comparator 44 is greater than the inversion input terminal voltage in a state wherein a High state signal is being output from the driver circuit 46, the output signal of the driver circuit 46 remains in a High state. When the voltage supply from the AC input stops, and the primary side input voltage drops, the non-inversion input terminal voltage of the BO comparator 44 becomes lower than the inversion input terminal voltage. Thereupon, the output signal of the driver circuit 46 inverts to a Low state, the switching operation of the MOSFET 19 stops, and the brown-out function comes into operation.

The latch circuit 49 is connected to the driver circuit 46. When an abnormal state such as a rise in the secondary side output voltage, control IC 31a heat generation, or a drop in the secondary side output voltage is detected, the latch circuit 49 compulsorily switches the output of the driver circuit 46 to a Low state for the sake of overvoltage protection, overheat protection, or overcurrent protection, thereby stopping the supply of power to the secondary side output. This state is maintained until the VCC power supply voltage drops and the control IC 31a is reset. For example, although not particularly limiting, the elements configuring each circuit and the like of the control IC 31a are formed on the same semiconductor substrate.

The invention is characterized by including the overvoltage restricting resistor 91 across a dielectric above a JFET, which is a starting element inside the control IC 31a. Therefore, it is sufficient that a lateral normally-on junction field effect transistor (JFET), not being limited to the heretofore described JFET, is of a configuration wherein a drift region is formed so as to surround a drain region, and a source region is disposed around the drift region.

The invention not being limited to the heretofore described embodiments, various changes are possible. For example, the numeric values given in the first to sixth embodiments being examples, the invention is not limited to these numeric values.

In the embodiments, a description has been given of a starting element including two JFETs, those being the JFETs 81 and 82 or JFETs 610 and 611, but the invention is also applicable to a case wherein the first source electrodes 112 and 711 or first and second source electrode wiring 113 and 712 are connected to form one source electrode. In the case of the starting circuits 41a, 41b, and 41c shown in FIGS. 7, 15, and 19, it is sufficient that the one connected source electrode is electrically connected to the resistor 66, the source of the PMOS transistor 67, and the source of the NMOS transistor 69. Alternatively, it is sufficient that the resistor 66, NMOS transistor 68, NMOS transistor 71, resistor 72, and on/off terminal 63 are eliminated from the starting circuits 41a, 41b, and 41c shown in FIGS. 7, 15, and 19, and the source electrode of the one connected JFET is connected to the sources of the PMOS transistor 67 and PMOS transistor 69.

Also, advantages are achieved in that it is possible to reduce the protective circuit configuration cost and the cost for stringently managing the assembly environment, and to reduce an increase in cost caused by increasing functionality in order to include an overvoltage monitoring function.

As heretofore described, the semiconductor device according to the invention can have high overvoltage resistance, and is useful in a semiconductor device having a junction field effect transistor and resistor element on the same substrate, and in a switching power supply control IC and switching power supply device in which the semiconductor device is used.

What is claimed is:
1. A semiconductor device, comprising:
a lateral junction field effect transistor formed in an upper portion of a semiconductor substrate;
a dielectric provided on the junction field effect transistor;
relay wiring, provided inside the dielectric, and a pad, provided on the dielectric, electrically connected to the relay wiring, to which voltage is applied from the exterior; and
a first resistor element, electrically connected between, and in contact with, the drain of the junction field effect transistor and the relay wiring, respectively, provided inside the dielectric on the junction field effect transistor,
wherein an outer peripheral edge of the first resistor element that is provided inside the dielectric on the junction field effect transistor is disposed closer to an inner edge of the semiconductor device than is an outer peripheral edge of the pad,
wherein the pad provided on the dielectric extends to the inner edge of the semiconductor device, and
wherein no other pad is disposed between the outer peripheral edge of the pad and an inner edge of the drain.
2. The semiconductor device according to claim 1, comprising
a second resistor element and third resistor element configuring a resistive voltage dividing circuit inside the dielectric; and
a planar form wherein the first resistor element, second resistor element, and third resistor element are formed contiguously in the order of the first resistor element, second resistor element, and third resistor element from the inner side is a spiral form.
3. The semiconductor device according to claim 1, wherein the semiconductor device is formed on an IC chip.
4. A switching power supply device comprising:
the semiconductor device according to claim 1; and
a starting circuit connected to the semiconductor device.
5. The semiconductor device according to claim 1, wherein a resistance value of the first resistance element is less than or equal to 200 ohms.
6. A semiconductor device, comprising:
a second conductivity type drift region formed in an upper portion of a first conductivity type semiconductor substrate;
a drain electrode connected to the drift region;
a second conductivity type source region provided in contact with the drift region in an upper portion of the semiconductor substrate around the drift region;
a first conductivity type gate region disposed in contact with the drift region in an upper portion of the semiconductor substrate;
a dielectric formed on the surface of the drift region;
a gate electrode connected to the gate region;
a source electrode connected to the source region;
relay wiring, provided inside the dielectric, and a pad, provided on the dielectric, electrically connected to the relay wiring, to which voltage is applied from the exterior; and a first resistor element, electrically connected between, and in contact with, the drain electrode and the relay wiring, respectively, embedded inside the dielectric on the drift region, wherein an outer peripheral edge of the first resistor element that is provided inside the dielectric on the junction field effect transistor is disposed closer to an inner edge of the semiconductor device than is an outer peripheral edge of the pad, wherein the pad provided on the dielectric extends to the inner edge of the semiconductor device, and wherein no other pad is disposed between the outer peripheral edge of the pad and an inner edge of the drain.

7. The semiconductor device according to claim 6, comprising a second resistor element configuring a resistive voltage dividing circuit embedded inside the dielectric, wherein one end of the second resistor element is electrically connected to the relay wiring.

8. The semiconductor device according to claim 7, further comprising a third resistor element configuring the resistive voltage dividing circuit embedded inside the dielectric and, one end of the third resistor element being connected to the other end of the second resistor element, comprising intermediate tap wiring connected to the connection place.

9. The semiconductor device according to claim 8, wherein the planar form of the second resistor element and third resistor element is a spiral form wherein the second resistor element and third resistor element are formed contiguously in order from the inner side.

10. The semiconductor device according to claim 8, wherein the planar form of the first resistor element, second resistor element, and third resistor element is a spiral form wherein the first resistor element, second resistor element, and third resistor element are formed contiguously in order from the inner side.

11. The semiconductor device according to claim 6, further comprising a second resistor element configuring a resistive voltage dividing circuit embedded inside the dielectric, wherein one end of the second resistor element is electrically connected to the drain electrode.

12. The semiconductor device according to claim 11, further comprising a third resistor element configuring the resistive voltage dividing circuit embedded inside the dielectric and, one end of the third resistor element being connected to the other end of the second resistor element, comprising intermediate tap wiring connected to the connection place.

13. The semiconductor device according to claim 12, wherein the planar form of the second resistor element and third resistor element is a spiral form wherein the second resistor element and third resistor element are formed contiguously in order from the inner side.

14. The semiconductor device according to claim 12, wherein the planar form of the first resistor element, second resistor element, and third resistor element is a spiral form wherein the first resistor element, second resistor element, and third resistor element are formed contiguously in order from the inner side.

15. The semiconductor device according to claim 6, further comprising a second conductivity type drain region, of an impurity concentration higher than that of the drift region, formed in a surface layer of the semiconductor substrate in a region sandwiched between the drift region and drain electrode.

16. The semiconductor device according to claim 6, further comprising:

a first source electrode connected to one portion of the source region; and a second source electrode connected to the remaining portion of the source region.

17. The semiconductor device according to claim 6, wherein a plurality of the source region are formed around the drift region, and the gate region is formed in contact with the plurality of source regions and the drift region so as to surround the plurality of source regions and the drift region.

18. A semiconductor device, comprising:

a lateral junction field effect transistor formed in an upper portion of a semiconductor substrate;

a dielectric provided on the junction field effect transistor;

relay wiring, provided inside the dielectric, and a pad, provided on the dielectric, electrically connected to the relay wiring, to which voltage is applied from the exterior; and a first resistor element, electrically connected between, and in contact with, the drain of the junction field effect transistor and the relay wiring, respectively, provided inside the dielectric on the junction field effect transistor, wherein an outer peripheral edge of the first resistor element that is provided inside the dielectric on the junction field effect transistor is disposed closer to an inner edge of the semiconductor device than is an outer peripheral edge of the pad, wherein the pad provided on the dielectric extends to the inner edge of the semiconductor device, and wherein the first resistor element is disposed between an inner edge of the drain and all pads that are electrically connected to the drain.

* * * * *